United States Patent [19]

Kuroda

[11] Patent Number: 5,524,093
[45] Date of Patent: Jun. 4, 1996

[54] SEMICONDUCTOR MEMORY DEVICE HAVING AN ARRANGEMENT TO REDUCE STRESSES ON NON-SELECTED FERROELECTRIC CAPACITORS WHILE ACHIEVING HIGH INTEGRATION

[75] Inventor: Kenichi Kuroda, Tachikawa, Japan

[73] Assignee: Hitachi, Ltd., Tokyo, Japan

[21] Appl. No.: 394,248

[22] Filed: Feb. 24, 1995

[30] Foreign Application Priority Data

Feb. 24, 1994 [JP] Japan ..................................... 6-051273

[51] Int. Cl.$^6$ .............................. G11C 7/00; G11C 11/22
[52] U.S. Cl. ........................... 365/145; 365/149; 365/203; 365/230.03
[58] Field of Search .................................... 365/145, 149, 365/203, 230.03

[56] References Cited

U.S. PATENT DOCUMENTS

| | | | |
|---|---|---|---|
| 5,010,518 | 4/1991 | Toda | 365/145 |
| 5,198,994 | 3/1993 | Natori | 365/145 |
| 5,297,077 | 3/1994 | Imai et al. | 365/145 |
| 5,373,463 | 12/1994 | Jones, Jr. | 365/145 |

FOREIGN PATENT DOCUMENTS

| | | |
|---|---|---|
| 3-36763 | 2/1991 | Japan . |
| 4-90189 | 3/1992 | Japan . |
| 4-336477 | 11/1992 | Japan . |

*Primary Examiner*—David C. Nelms
*Assistant Examiner*—Son Dinh
*Attorney, Agent, or Firm*—Antonelli, Terry, Stout & Kraus

[57] ABSTRACT

A high integration semiconductor memory device which can reduce stresses placed on non-selected ferroelectric capacitors. A plurality of subblock memory circuits are provided wherein first electrodes forming a plurality of ferroelectric capacitors are respectively provided at first address selection switches, a plurality of other electrodes arranged side by side in the horizontal direction are provided so as to meet at right angles to the first electrodes, and the plurality of ferroelectric capacitors are formed at points where the first electrodes and the other electrodes respectively intersect. Different addresses are respectively assigned to the first address selection lines of the respective subblock memory circuits and common addresses are respectively assigned to the second address selection lines of the plurality of subblock memory circuits, thereby forming a shared address selection circuit. The first address selection line, first switching elements and one second address selection line can be used to develop polarization in the ferroelectric capacitors. Further, the remaining second address selection lines are supplied with such a non-selected potential that a voltage applied to the ferroelectric capacitors reaches substantially half the voltage applied to the selected ferroelectric capacitor. On the other hand, when the first address selection line is brought into a non-selected state and the first switching elements are brought into an OFF state, the plurality of second address selection lines are supplied with such a non-selected potential that the voltage applied to the ferroelectric capacitors reach zero.

11 Claims, 31 Drawing Sheets

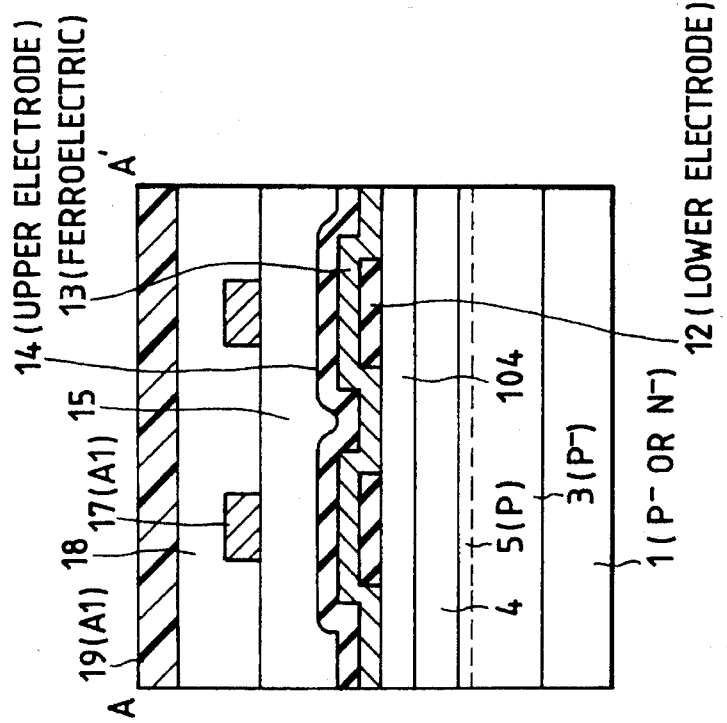
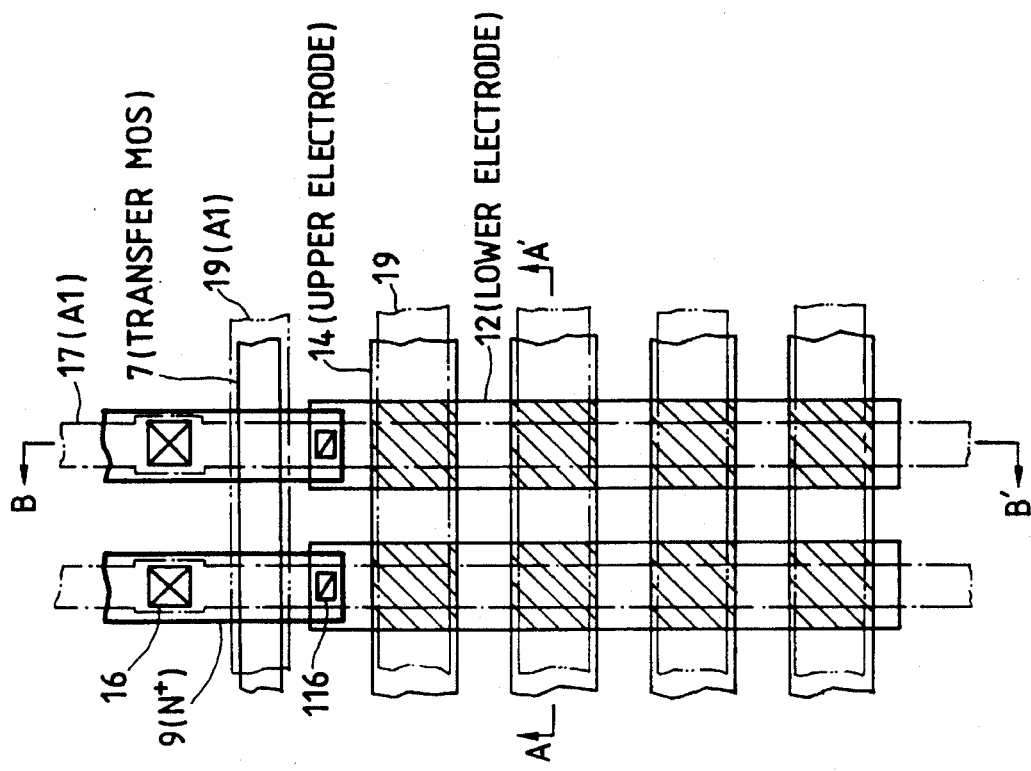

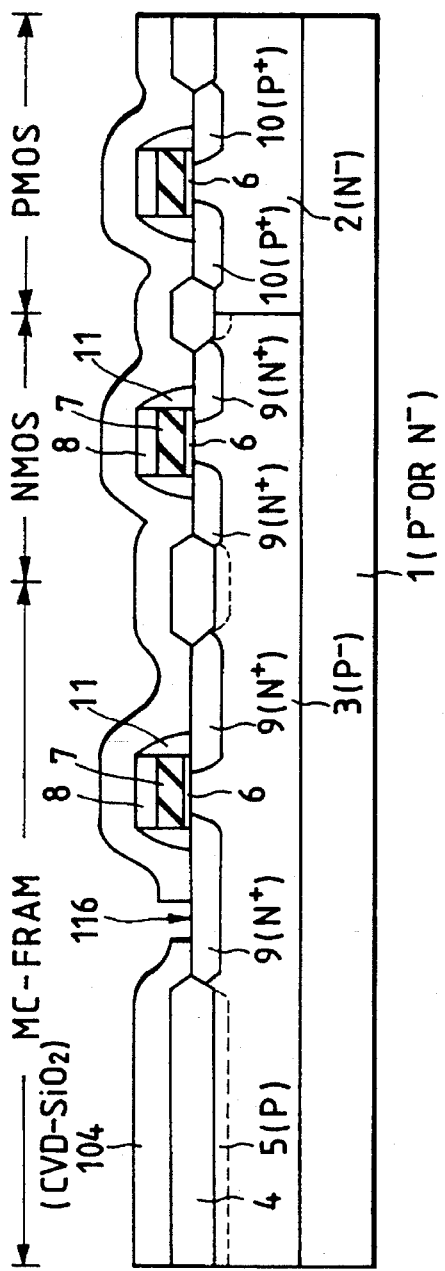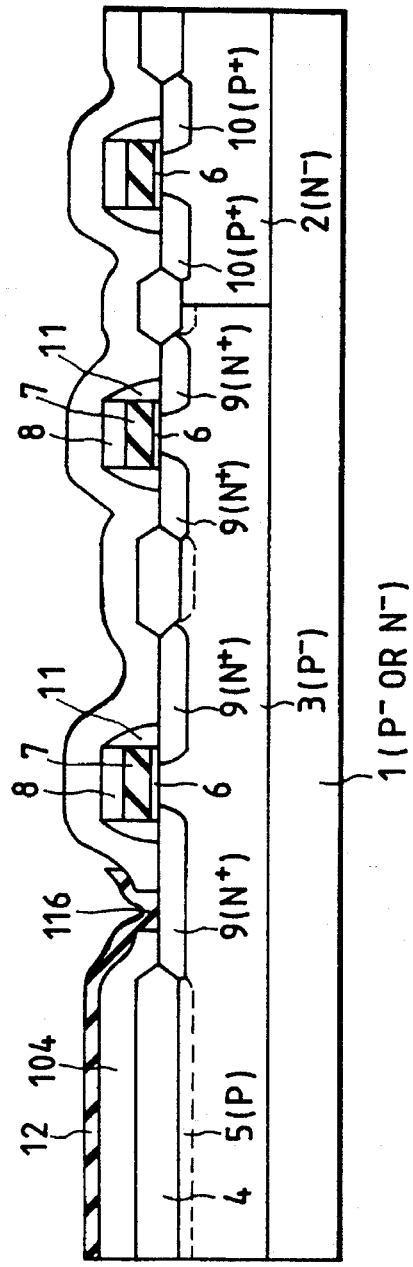

5,524,093

1

SEMICONDUCTOR MEMORY DEVICE HAVING AN ARRANGEMENT TO REDUCE STRESSES ON NON-SELECTED FERROELECTRIC CAPACITORS WHILE ACHIEVING HIGH INTEGRATION

BACKGROUND OF THE INVENTION

The present invention relates to a semiconductor memory device, and particularly to a technique used and effective for a device using ferroelectric capacitors.

There has been known a semiconductor device provided with a plurality of ferroelectric capacitors with respect to a single switching element as shown in FIG. 32 to bring it into high integration or the like. This type of semiconductor device has been disclosed in Japanese Patent Laid-Open No. 4-90189.

The inventors of the present application have found various problems that must solve stresses placed on non-selected ferroelectric capacitors, which are inevitably produced when the plurality of ferroelectric capacitors are provided with respect to the single switching element as described above.

SUMMARY OF THE INVENTION

It is an object of the present invention to provide a semiconductor memory device capable of reducing stresses exerted on non-selected ferroelectric capacitors while bringing it into substantial high integration.

It is another object of the present invention to provide a semiconductor memory device capable of achieving a stable operation thereof while bringing it into high integration.

The above and other objects and novel features of the present invention will become apparent from the following description and the appended claims, taken in conjunction with the accompanying drawings.

The summary of a typical one of the invention disclosed in the present application will be described in brief as follows. Namely, each of a plurality of subblock memory circuits is provided wherein first electrodes are respectively electrically common-connected to one ends of first switching elements serving as a first means, whose control terminals are electrically connected to a first address selection line, the other electrodes are arranged side by side in flat form so as to meet at right angles to the first electrodes are set as second address selection lines and ferroelectric capacitors are formed at points where the first electrodes and the other electrodes respectively intersect. Different addresses are assigned to the first address selection lines of the respective subblock memory circuits and common addresses are respectively assigned to the second address selection lines of the plurality of subblock memory circuits, thereby forming a common address selection circuit. When the first address selection line is in a selected state and the first switching elements are turned ON, one of the plurality of second address selection lines is brought into a selected state and is supplied with a voltage that develops polarization in each of the ferroelectric capacitors. Further, the remaining second address selection lines are brought into such a non-selected potential that a voltage applied to each of the ferroelectric capacitors reaches substantially half the voltage applied to the selected ferroelectric capacitor. When the first address selection line is brought into a non-selected state and the first switching elements are turned OFF, the plurality of second address selection lines are supplied with such a non-selected potential that the voltage applied to each of the ferroelectric capacitors reaches substantially zero.

According to the first means, a single selection circuit can be provided with respect to the plurality of second address selection lines which form the other electrodes of the ferroelectric capacitors arranged in high density. Therefore, the ferroelectric capacitors can be brought into high density and high integration as much as possible. While, since no voltage is applied to each of the ferroelectric capacitors of each subblock memory circuit, which correspond to the non-selected switching elements, stresses placed on these ferroelectric capacitors can greatly be reduced.

The summary of other typical one of the invention disclosed in the present application will be described in brief as follows. Namely, second switching elements are provided on shared one electrodes side of the ferroelectric capacitors as second means. When first switching elements of each subblock memory circuit, which correspond to the second switching elements, are in an on state, the second switching elements are brought into an OFF state. Further, when the corresponding first switching elements of each subblock memory circuit are in an off state, the second switching elements are brought into an ON state. In this condition, the same potential as that applied to non-selected second selection lines is supplied to the second switching elements.

According to the second means, stresses placed on the ferroelectric capacitors of each subblock memory circuit, which correspond to non-selected switching elements, can be greatly be reduced.

The summary of a further typical one of the invention disclosed in the present application will be described in brief as follows. Namely, each of non-selected subblock memory circuits of the plurality of subblock memory circuits is supplied with a precharge voltage substantially equal to half the voltage that develops polarization in the ferroelectric capacitors through the first switching elements as a third means. The first switching elements of the subblock memory circuit selected after such a precharge operation has been completed, are turned ON. Further, one of a plurality of second address selection lines is brought into a selected state and is supplied with a voltage that develops polarization in the selected ferroelectric capacitor. Thereafter, the remaining second address selection lines are set to such a non-selected potential that a voltage applied to each of the ferroelectric capacitors reaches substantially half the voltage applied to the selected ferroelectric capacitor.

According to the third means, stresses exerted on the ferroelectric capacitors of the subblock memory circuit, which correspond to the non-selected switching elements, can be greatly reduced while the second address selection lines of each subblock are made common or shared in a simple structure.

The summary of a still further typical one of the invention disclosed in the present application will be described in brief as follows. Namely, memory cell arrays each having memory cells each comprised of a single switching element and a single ferroelectric capacitor are provided side by side as fourth means. The above one electrodes are omitted from such memory cell arrays and the other electrodes of dummies corresponding to the second selection lines are provided, whereby layout patterns of the second address selection lines are constructed in a manner similar to those of each subblock memory circuit.

According to the fourth means, the dimensions of the patterns can be prevented from varying due to non-dense and dense states of the other electrodes of the capacitors, while memory blocks different in structure from each other are being formed. Further, an operating margin can be ensured.

BRIEF DESCRIPTION OF THE DRAWINGS

FIG. 27 is a view for describing a layout showing a still further example of the memory array of the semiconductor memory device according to the present invention;

FIG. 28 is a cross-sectional view taken along line A - A' of FIG. 27;

FIGS. 30(A) and 30(B) are respectively cross-sectional views showing partial manufacturing processes for describing one example of a method of manufacturing the semiconductor memory device shown in FIG. 27;

DETAILED DESCRIPTION OF THE PREFERRED EMBODIMENTS

Reference is made to copending our U.S. application, Ser. No. 08/111,507, filed Aug. 24, 1993, the subject matter of which is incorporated herein by reference.

Figure 2:
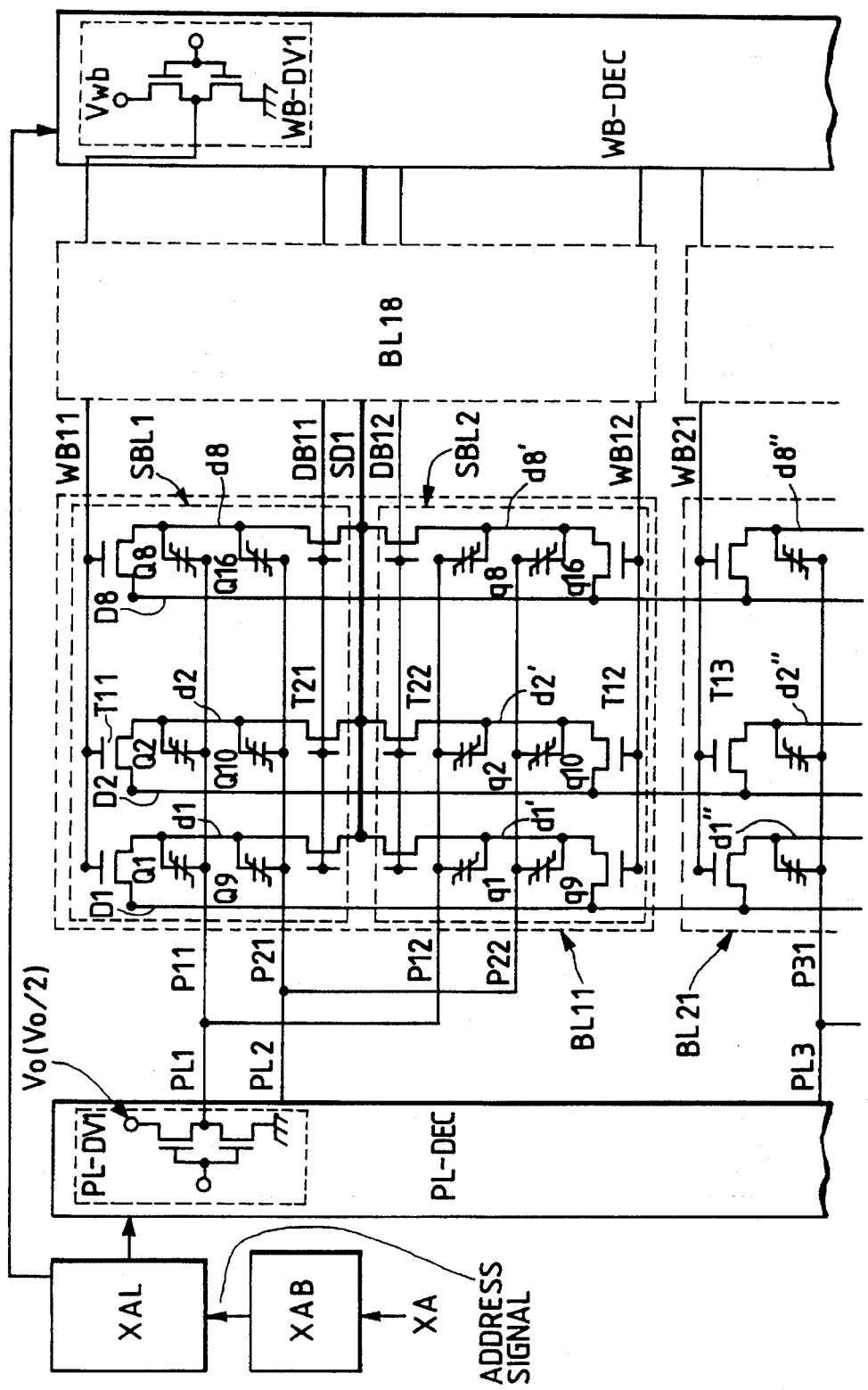
FIG. 2 is a partial block diagram illustrating one embodiment of the semiconductor memory device according to the present invention.
Figure 3:
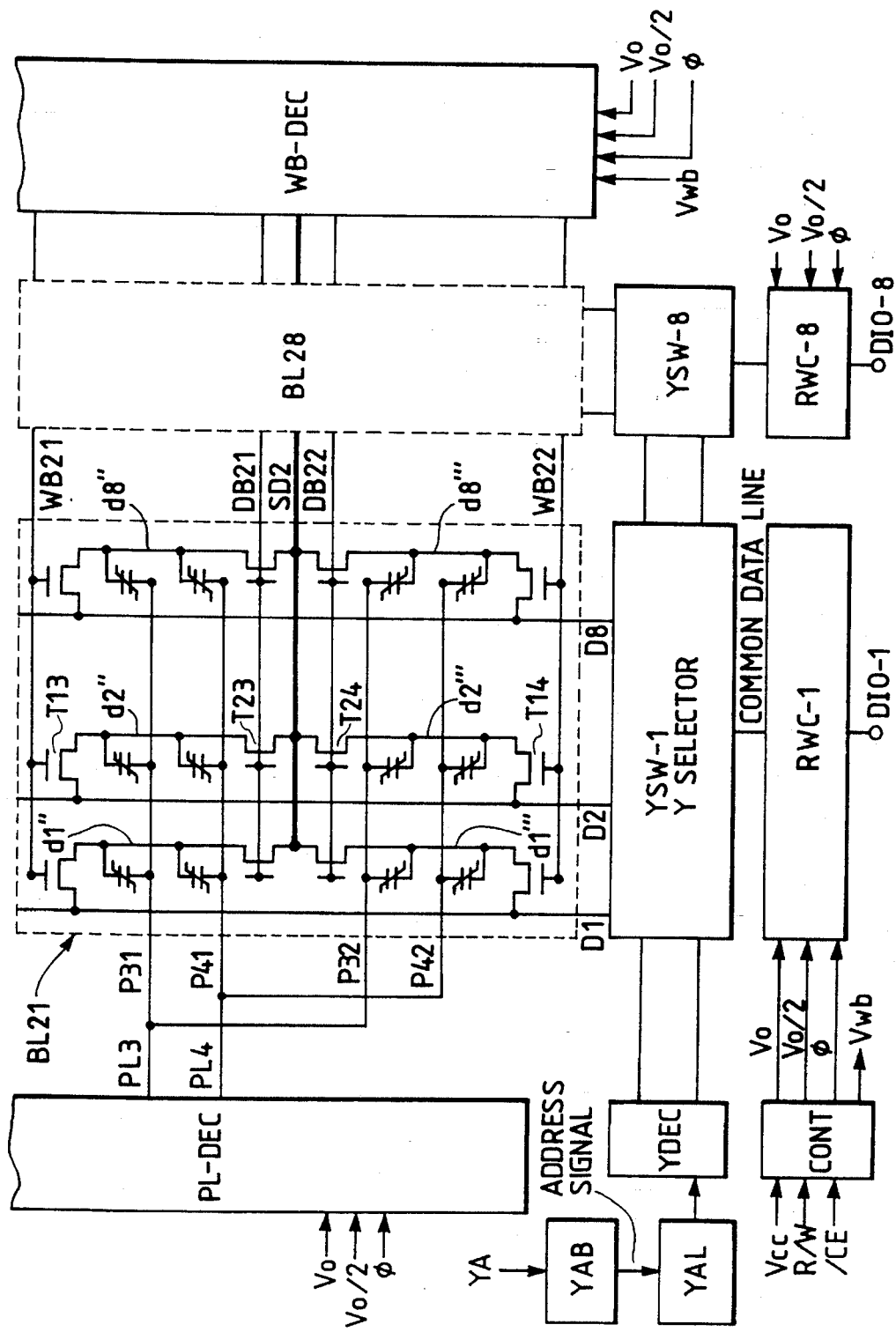
FIG. 3 is a residual partial block diagram showing the one embodiment of the semiconductor memory device shown in FIG. 1.

FIG. 2 is a partial block diagram showing one embodiment of a semiconductor memory device according to the present invention. FIG. 3 is a residual partial block diagram illustrating the embodiment shown in FIG. 2. To make clear a relation between FIGS. 2 and 3, FIG. 2 is drawn so as to partially overlap with FIG. 3. Respective circuit blocks and circuit elements shown in the same drawings are formed on a single semiconductor substrate such as monocrystalline silicon by a known technique for manufacturing a semiconductor integrated circuit. In the present application, MOSFETs are used in the sense of insulated gate field effect transistors (IGFET).

The semiconductor memory device according to the present embodiment is formed on a single semiconductor substrate and performs data writing/reading operations in 8-bit units. 2×8 memory blocks are represented as a memory array. Namely, eight memory blocks are arranged in a transverse or horizontal direction, whereas two memory blocks are arranged in a longitudinal or vertical direction. The eight memory blocks arranged in the horizontal direction are provided so as to correspond to eight data terminals DIO-1 through DIO-8. In the same drawing, circuits associated with the two of these data terminals are shown as typical ones by way of illustrative example.

One memory block is divided into two subblock memory circuits SBL1 and SBL2 as shown in a memory block BL11. The subblock memory circuit SBL1 comprises a plurality of unit memory circuits each comprised of a switch MOSFET T11, a plurality of ferroelectric capacitors Q2 and Q10 (two ferroelectric capacitors in the same drawing) with respect to the switch MOSFET T11, and a switch MOSFET T21 provided to prevent stresses from occurring. Namely, eight unit memory circuits are provided so as to correspond to eight main data lines D1 through D8.

In the subblock memory circuit SBL1, data lines d1 through d8 are provided so as to correspond to eight switches MOSFETs used as representatives of the MOSFETs T11 whose gates are commonly connected to a word block line WB11 used as a first address selection line. These data lines d1 through d8 respectively form one electrode of the above ferroelectric capacitors Q1 through Q8 and Q9 through Q16 to be described later. In the present embodiment, switches MOSFETs for preventing stresses from occurring, which are representatives of the MOSFETs T21, are provided at the other ends of the data lines d1 through d8 and are electrically connected to a stress-preventive voltage supply line SD1. Another electrode P11 for forming the ferroelectric capacitors Q1 through Q8 is formed as a common electrode. The electrode P11 is arranged so as to meet at right angles to the data lines d1 through d8 as a second address selection line. An electrode P12 is provided side by side with the electrode P11 so as to correspond to other ferroelectric capacitors Q9 through Q16.

Even in the case of other subblock memory circuit SBL2 for forming the memory block BL1, data lines d1' through d8' are provided in a manner similar to the above so as to be associated with eight switch MOSFETs used as representatives of the MOSFETs T12 whose gates are commonly connected to a word block line WB12 used as a first address selection line. These data lines d1' through d8' respectively form one electrode of the above ferroelectric capacitors q1 through q8 and q9 through q16 to be described later. In the present embodiment, switch MOSFETs for preventing stresses from occurring, which are representatives of the MOSFETs T22, are provided at the other ends of the data lines d1' through d8' and are electrically connected to the stress-preventive voltage supply line SD1. Another electrode P12 for forming the ferroelectric capacitors q1 through q8 is formed as a common electrode. The electrode P12 is disposed side by side with other address selection line P22 for forming other ferroelectric capacitors q9 through q16, so as to meet at right angles to the data lines d1' through d8' as the second address selection line.

Namely, the memory block BL1 is constructed such that the two subblock memory circuits SBL1 and SBL2 are symmetrically disposed as seen in upward and downward directions with the stress-preventive voltage supply line SD1 interposed therebetween. Although restrictions are not imposed on the memory block BL1 in particular, addresses are assigned to the electrodes P11 and P12 and P21 and P22 each used as the second address selection line in order from above without symmetrically assigning them thereto as seen in the upward and downward direction to substantially equalize wiring lengths to each other.

The ferroelectric capacitor Q1 or the like itself forms a single memory cell. Further, the ferroelectric capacitor Q1 or the like can be formed by simply disposing the two electrodes d1 and P11 or the like so as to meet at right angles to each other with the ferroelectric interposed therebetween. Namely, when the electrodes d1 and P11 are respectively formed in layers different from each other and the ferroelectric is formed at the position where both electrodes intersect and in a layer between both electrodes, a capacitor can be formed in high density. If, however, an address selection circuit for a memory access is taken into consideration, it is useless to dispose each memory cell in high density. It is therefore necessary to match each memory cell with the address selection circuit in layout. Namely, when a memory circuit is taken into consideration, a memory array must be matched with an address selection circuit for selecting the memory array in terms of a geometrical element layout on a semiconductor substrate. When the matching between the address selection circuit and the memory array is low and the degree of integration of the address selection circuit is lower than that of integration of the memory array, the degree of integration of the semiconductor memory device is rate-determined depending on the degree of integration of the address selection circuit, so that high integration is restricted.

In the present embodiment, the same address is assigned to the electrodes P11 and P12 each used as the second address selection line for each of the subblock memory circuits SBL1 and SBL2, and both electrodes P11 and P12 are electrically connected to a common plate PL1. Similarly, the same address is assigned to the electrodes P21 and P22 each used as the other second address selection line and both electrodes P21 and P22 are electrically connected to a common plate PL2. Further, a common plate line driver PL-DV1 used as an address selection circuit is provided for the common plates PL1 and PL2.

Owing to such a structure, the common plate line driver PL-DV1 can be formed by a large pitch which is substantially about twice the pitch of each of the other electrodes P11 through P22 each used as the second address selection line. Further, the matching between the memory array and the address selection circuit can be made.

A memory block BL21 shown as other representative is also constructed in a manner similar to the above. Further, memory blocks BL18 and BL28 each shown as a black box indicated by a dotted line in the same drawing and other memory blocks omitted between the memory blocks BL18 and BL28 are constructed in the same manner as described above. Other electrodes P11 and the like of the ferroelectric capacitors, each of which is used as the second address selection line, extend in the horizontal direction as they are and form other electrodes of ferroelectric capacitors used as memory cells included in other memory block selection circuits BL18 and the like to which the same address is assigned.

A Y selector YSW-1 selects one of the main data lines D1 through D8 and is electrically connected to a common data line. The common data line is electrically connected to a writing/reading circuit RWC1 to which a data terminal DIO-1 is connected. Incidentally, the Y selector YSW-1 is constructed such that a switch MOSFET for supplying a voltage Vo/2 corresponding to half the write (read) voltage Vo is provided even for each of non-selected main data lines to reduce stresses exerted on non-selected memory cells.

A Y selector and a writing/reading circuit constructed in the same manner described above are provided for the remaining seven data terminals DIO-2 through DIO-8. In the same drawing, a Y selector 7 and a writing/reading circuit RWC7 corresponding to the data terminal DIO-7 of these data terminals are shown as representatives and other circuits are omitted.

A word line (block selection line WB11 or the like) used as the first address selection line for the memory blocks of the memory array and a word line (common plate line PL1 or the like) used as the second address selection line are supplied with selection/non-selection potentials from decoders WB-DEC and PL-DEC. An address latch circuit XAL takes in an X-system address signal XA through an address buffer XAB. The decoders WB-DEC and PL-DEC decode the X-system address signal XA received by the address latch circuit XAL to thereby produce selection/non-selection signals for the first and second address selection lines in association with an operating sequence.

The respective switches MOSFETs of the Y selector YSW-1 through YSW-8 are switch-controlled by the Y decoder YDEC. An address latch circuit YAL takes in a Y-system address signal YA through an address buffer YAB. The Y decoder YDEC decodes the Y-system address signal YA received by the address latch circuit YAL so as to connect a selected one data line to the writing/reading circuit RWC and supplies the bias voltage Vo/2 to the remaining seven non-selected data lines.

A control circuit CONT outputs a write voltage Vo and a half write voltage Vo/2 based on a power supply voltage Vcc and produces a timing signal φ corresponding to a write/read signal R/W and the like. Further, the control circuit CONT is supplied with a chip select signal /CE and an unillustrated high voltage for a forced refreshing process (or poling process) as needed. When it is desired to provide a block access operation and an automatic write verifying function, a logic circuit for their sequential control is provided.

Figure 1:
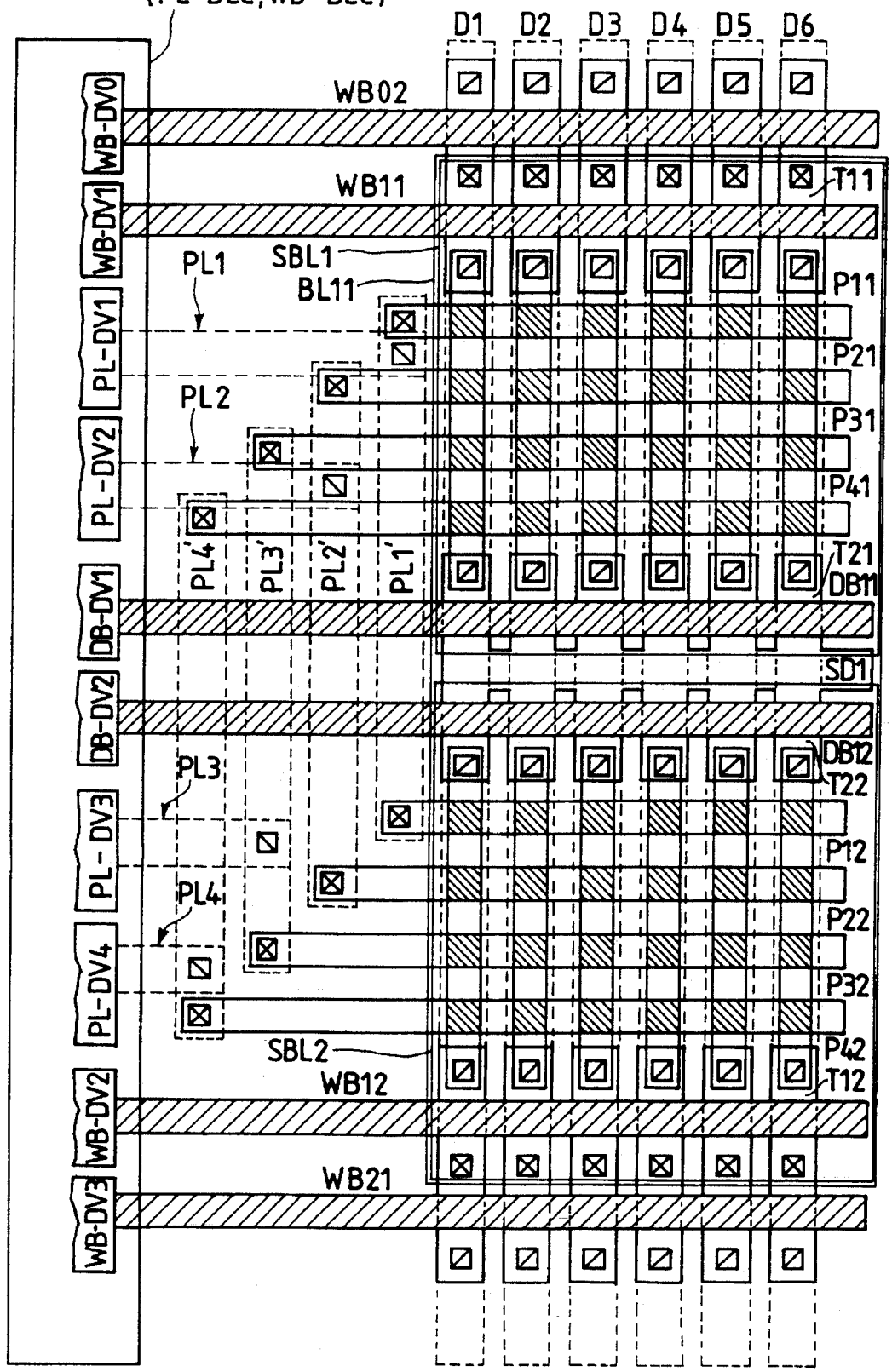
FIG. 1 is a view for describing a layout pattern showing one example of a memory block employed in a semiconductor memory device according to the present invention.

FIG. 1 is a view for describing a layout pattern showing one example of a memory block employed in a semiconductor memory device according to the present invention. FIG. 1 illustrates one example of one memory block divided into two subblock memory circuits as seen in upward and downward directions. Each of the subblock memory circuits substantially corresponds to one memory block shown in FIG. 2.

A description will now be made of the difference between components of the memory block shown in FIG. 2 and those of the memory block shown in FIG. 1. Each of the subblock memory circuits of the memory block shown in FIG. 2 comprises unit memory circuits each including a single switch MOSFET electrically connected to a first address selection line, a single stress-preventive switch MOSFET electrically connected to a stress-preventive voltage supply line and two ferroelectric capacitors electrically connected between the above switches MOSFETs. On the other hand, each of the subblock memory circuits of the memory block shown in FIG. 1 comprises a plurality of unit memory circuits each including a single switch MOSFET electrically connected to a first address selection line, a single stress-preventive switch MOSFET electrically connected to a stress-preventive voltage supply line, and four ferroelectric capacitors electrically connected between the above switches MOSFETs. Further, the memory block shown in FIG. 2 is made up by eight main data lines, whereas the memory block shown in FIG. 1 is constructed of six main data lines. In FIG. 1, four common plate drivers are provided for each memory block so as to correspond to the four ferroelectric capacitors included in the unit memory circuits of each of the subblock memory circuits in the memory block.

Main data lines D1 through D6 indicated by dotted lines along the vertical direction, data lines forming an upper subblock memory circuit SLB1 connected thereto through switches MOSFETs T11 and the like formed so as to be superposed on the main data lines D1 through D6, and electrodes P11 through P41 provided as second address selection lines so as to meet at right angles to these data lines, are formed in the same drawing. Gates of the switches MOSFETs T11 and the like are formed integrally with a word block selection line WB11. One example in which four ferroelectric capacitors are formed for each switch MOSFETs T11, for example, is shown as the subblock memory circuit SBL1 employed in the present embodiment.

Although particular restrictions are not imposed on the word block selection line WB11, the word block selection line WB11 is formed as a wired layer corresponding to a first layer and is made up of a polysilicon layer, for example. The data lines in the subblock memory circuit SBL1 connected thereto via the switches MOSFETs T11 and the like and the plate electrodes P11 through P41 provided so as to meet at right angles to the data lines are comprised of wired layers corresponding to second and third layers and are respectively formed of metal wired layers made up of platinum as will be described later. Other ends of the data lines in the subblock memory circuit SBL1 are respectively provided with stress-preventive switches MOSFETs T21 and the like and are electrically connected to the above stress-preventive voltage supply line SD1. Gates of the stress-preventive switches MOSFETs T21 and the like are electrically connected to a data block line DB11.

A lower subblock memory circuit SBL2 are formed symmetrically with respect to the above stress-preventive voltage supply line SD1. Namely, stress-preventive switches MOSFETs T22 and the like are provided adjacent to the stress-preventive voltage supply line SD1. Gates of the stress-preventive switches MOSFETs T22 and the like are electrically connected to a data block line DB12. Main data lines D1 through D6 indicated by dotted lines along the vertical direction, data lines forming a lower subblock memory circuit SBL2 connected thereto through switches MOSFETs T12 and the like formed so as to be superposed on the main data lines D1 through D6, and electrodes P12 through P42 provided as second address selection lines so as to meet at right angles to these data lines, are formed. Gates of the switches MOSFETs T12 and the like provided below the data lines are formed integrally with a word block selection line WB12. Although only one memory block is shown in the same drawing, other memory blocks are provided such that word block selection lines used for the other memory blocks are disposed adjacent to the word block selection line WB11 or WB12. Further, main data lines are disposed symmetrically with respect to a sequence of contacts of switches MOSFETs corresponding to the main data lines as seen in the upward and downward directions. Owing to such a symmetrical arrangement, a memory array can be laid out with sufficient efficiency without increasing the number of contacts.

In the present embodiment, the electrodes P12 through P42 of the subblock memory circuits SBL2 are electrically connected to common plates PL1 through PL4 through connecting lines or wires PL1' through PL4' which extend in the vertical direction on the driver side. Although not restricted in particular, each of the connecting wires PL1' through PL4' is used with a wire corresponding to a fourth layer and is made up of a metallic wired layer such as aluminum or the like.

The four common plate lines are provided so as to be divided into two sets, i.e., the common plate lines PL1 and PL2 and the common plate lines PL3 and PL4. The common plate lines PL1 and PL2 are respectively electrically connected to the electrodes P11 and P12 and the electrodes P21 and P22. The common plate lines PL3 and PL4 are respectively electrically connected to the electrodes P31 and P32 and the electrodes P41 and P42. Signals outputted from common plate line drivers PL-DV1 and PL-DV2 provided on the upper side are respectively sent to the electrodes P11 and P12 and the electrodes P21 and P22 through the common plate lines PL1 and PL2 each comprised of a wired layer corresponding to a fifth layer. Similarly, signals outputted from common plate line drivers PL-DV3 and PL-DV4 provided on the lower side are respectively sent to other common-connected electrodes P31 and P32 and P41 and P42 divided into two sets through the common plate lines PL3 and PL4 each comprised of a wired layer corresponding to the fifth layer.

Regardless of the fact that each of the unit memory circuits included in the individual subblock memory circuits has four plate lines (four ferroelectric capacitors), the common plate line driver for selecting one of the four plate lines may substantially be provided by two with respect to each of the subblock memory circuits owing to the above-described structure. By doing so, the entire circuit can be formed in high density while a memory array is being matched in geometry with an address selection circuit including both common plate line drivers for producing select signals used for the memory array and decoders. Namely, the convergence of the degree of integration of a semiconductor memory device to that of integration of the address selection circuit can be avoided or improved by making the degree of integration of the memory array greater than that of integration of the address selection circuit.

Figure 4:
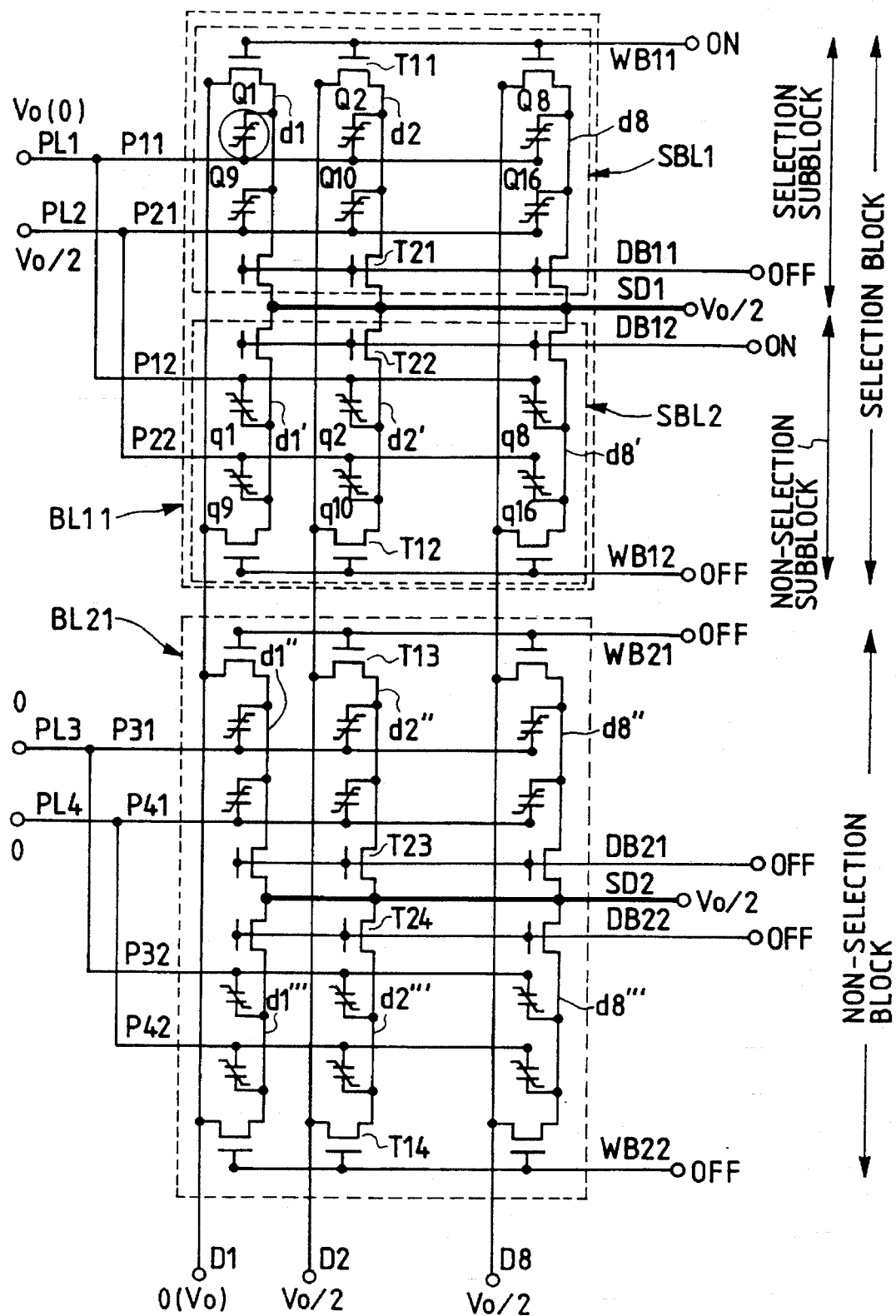
FIG. 4 is a circuit diagram for describing one example of a method of writing data into the semiconductor memory device shown in FIGS. 2 and 3 and reading it therefrom.

FIG. 4 is a circuit diagram for describing one example of a method of writing data into the semiconductor memory device and reading it therefrom. In the same drawing, both a selection block and a non-selection block are shown as representatives by way of illustrative example. In the present example, a voltage for causing the inversion or reversal of polarization in a ferroelectric capacitor Q1 or the like will be set as Vo and the reversal of polarization will not be produced under a voltage Vo/2 corresponding to half the voltage Vo.

Switches MOSFETs T11 and the like of a selection subblock SBL1 in a selection block BL11 are turned ON and switches MOSFETs T12 are turned OFF. Thus, data lines d1 through d8 of the subblock memory circuit SBL1 are electrically connected to their corresponding main data lines D1 through D8. At this time, the main data line D1 is selected from the main data lines D1 through D8, so that a write/read signal 0 (or Vo) is supplied to the selected main data line D1. Other non-selected main data lines D2 through D8 are supplied with the voltage Vo/2.

When a plate electrode P11 is selected and a writing or reading process is effected on the ferroelectric capacitor Q1 in the selection subblock SBL1, a common plate line PL1 is supplied with the voltage Vo (or 0) and other non-selected common plate line PL2 is supplied with the voltage Vo/2.

Thus, the voltage Vo is applied between both electrodes of the ferroelectric capacitor Q1 of the selection subblock SBL1 so as to enable the inversion of polarization. If the direction of polarization referred to above is equal to that of polarization in a state of retention of data by the ferroelectric capacitor Q1, its condition is of course maintained by the ferroelectric capacitor Q1. On the other hand, since only the voltage Vo/2 is applied to each of non-selected ferroelectric capacitors Q2 through Q8 each comprised of the selected plate electrode P11 and each of the non-selected data lines d2 through d8, the original condition of polarization is maintained as it is. Since only the voltage Vo/2 is applied to a ferroelectric capacitor Q9 comprised of the selected data line d1 and a non-selected plate electrode P12 in the same manner as described above, the original condition of polarization is held as it is. In the case of ferroelectric capacitors Q9 through Q16 each provided between each of the non-selected data lines d2 through d8 and a non-selected plate electrode P21, the voltage applied between both electrodes of each ferroelectric capacitor becomes equal to Vo/2. As a result, the reversal of polarization is not developed and a voltage of Vo/2 that causes stresses is not applied to each ferroelectric capacitor either.

Switches MOSFETs T12 and the like of a non-selection subblock SBL2 in the selection block BL11 are turned OFF and switches MOSFETs T22 are turned ON. Thus, data lines d1' through d8' of the non-selection subblock memory circuit SBL2 are respectively electrically connected to a stress-preventive voltage supply line SD1 and are supplied with a voltage of Vo/2. Therefore, since only a voltage of Vo/2 is applied even to each of ferroelectric capacitors q1 through q8 connected to the plate electrode P12 supplied with a voltage of Vo (or 0) by making commonality of the plate electrodes P11 and P12, the reversal of polarization is not developed. In the case of ferroelectric capacitors respectively provided between the non-selected data lines d1' through d8' and a non-selected plate electrode P22, the voltage applied between both electrodes of each ferroelectric capacitor becomes equal to Vo/2. As a result, the reversal of polarization is not developed and a voltage of Vo/2 that causes stresses is not applied to each ferroelectric capacitor either.

In the non-selection block BL21, switches MOSFETs T13, T23, T14 and T24 and the like electrically connected to main data lines D1 through D8 and a stress-preventive voltage supply line SD2 are respectively brought into an OFF state. Thus, data lines d1" through d8" and the like in the non-selection block BL21 are discharged to 0 V by an unillustrated discharge circuit and only 0 V is applied to each of plate electrodes P31 through P42. Therefore, no polarization is produced and the voltage that causes stresses is not applied.

Figure 5:
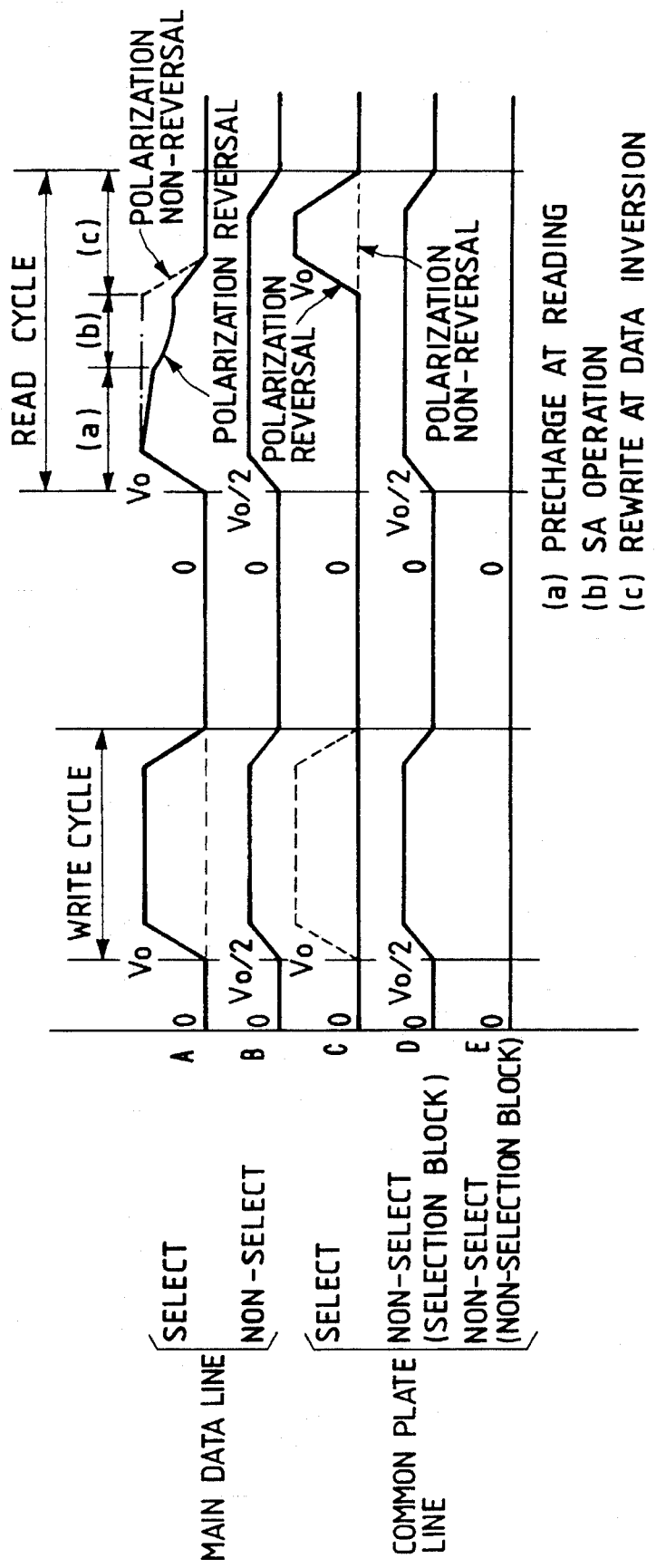
FIG. 5 is a schematic waveform chart for describing writing and reading operations of the semiconductor memory device shown in FIGS. 2 and 3.

FIG. 5 is a schematic waveform chart for describing writing and reading operations. During a write cycle, either Vo indicated by a solid line or 0 V indicated by a dotted line is supplied to a main data line selected from main data lines. On the other hand, Vo/2 is supplied to non-selected main data lines. Either 0 V indicated by a solid line or Vo indicated by a dotted line is supplied to a common plate line selected from common plate lines in contrast to the voltage supplied to the main data line selected from the main data lines. Further, a plate voltage for a non-selected common plate line in the selection block is set to Vo/2, whereas a plate voltage for a non-selected common plate line in the non-selection block is set to 0 V.

During a read cycle, a main data line selected from the main data lines is precharged to Vo for an (a) period as indicated by a solid line. Since the plate voltage is set to 0 V, the reversal of polarization is developed in the selected main data line. Thus, current, which flows incident to the occurrence of polarization, is sensed by a sense amplifier for a (b) period. Namely, a change in potential corresponding to the movement of charges due to the inversion of polarization appears in a corresponding data line and is sensed by the sense amplifier. On the other hand, a data line connected with a ferroelectric capacitor in which the reversal of polarization is not performed, does not cause a potential change. To return the reversal of polarization developed during the read cycle to the original state, the voltage supplied to the main data line selected as indicated by a (c) period and the voltage applied to the plate electrode are reversely set contrary to the read cycle. If the non-reversal of polarization takes place as indicated by a dotted line, the voltage applied to the main data line and the voltage applied to the plate electrode are both brought to 0 V. Thus, this state is held as it is. Even during the read cycle, the voltages supplied to non-selected main data lines and plate electrodes are processed in a manner similar to the above write cycle.

Figure 6:
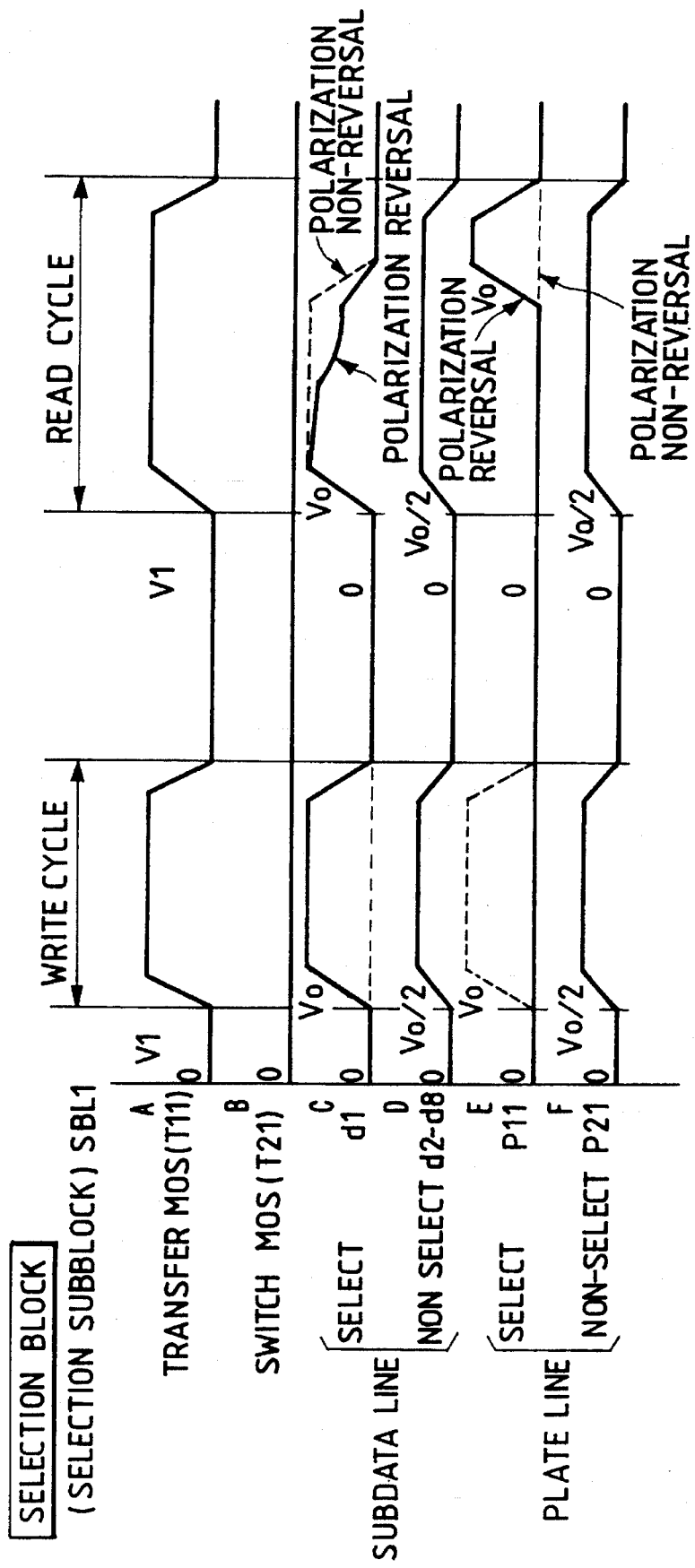
FIG. 6 is a schematic waveform chart for describing writing and reading operations executed by a selection subblock in a selection block employed in the semiconductor memory device shown in FIGS. 2 and 3.

FIG. 6 is a schematic waveform chart for describing writing and reading operations executed by the selection subblock SBL1 provided within the selection block. During a write cycle, a transfer MOSFET T11 for electrically connecting a data line to a main data line is brought into an ON state and a transfer MOSFET T21 for electrically connecting the data line to a stress-preventive voltage supply line is brought into an OFF state. As a result, a voltage Vo (or 0 V) for the selected main data line is applied to a selected data line d1 and a voltage Vo/2 for each of non-selected main data lines is applied to each of other non-selected data lines d2 through d8. Voltages applied to plate lines are similar to those shown in FIG. 5. Thus, a voltage Vo is applied to a ferroelectric capacitor formed between the selected data line d1 and the selected plate line P11. Only a voltage of Vo/2 is applied to other ferroelectric capacitors.

During a read cycle, the transfer MOSFET T11 for electrically connecting the data line to the main data line as described above, is turned ON and the transfer MOSFET T21 for electrically connecting the data line to the stress-preventive voltage supply line is turned OFF. Therefore, the selected data line d1 is precharged to Vo for an (a) period as indicated by a solid line. Further, since the voltage applied to a plate electrode is set to 0 V, the reversal or inversion of polarization is developed in the selected data line. Thus, current, which flows incident to the occurrence of polarization, is sensed by a sense amplifier for a (b) period. To return the reversal of polarization developed during the read cycle to the original state, the voltage supplied to the main data line selected as indicated by a (c) period and the voltage applied to the plate electrode are reversely set contrary to the read cycle. If the non-reversal of polarization takes place as indicated by a dotted line, the voltage applied to the main data line and the voltage applied to the plate electrode are both brought to 0 V. Thus, this state is held as it is. Even during the read cycle, the voltages supplied to non-selected main data lines and plate electrodes are processed in a manner similar to the above write cycle.

Figure 7:
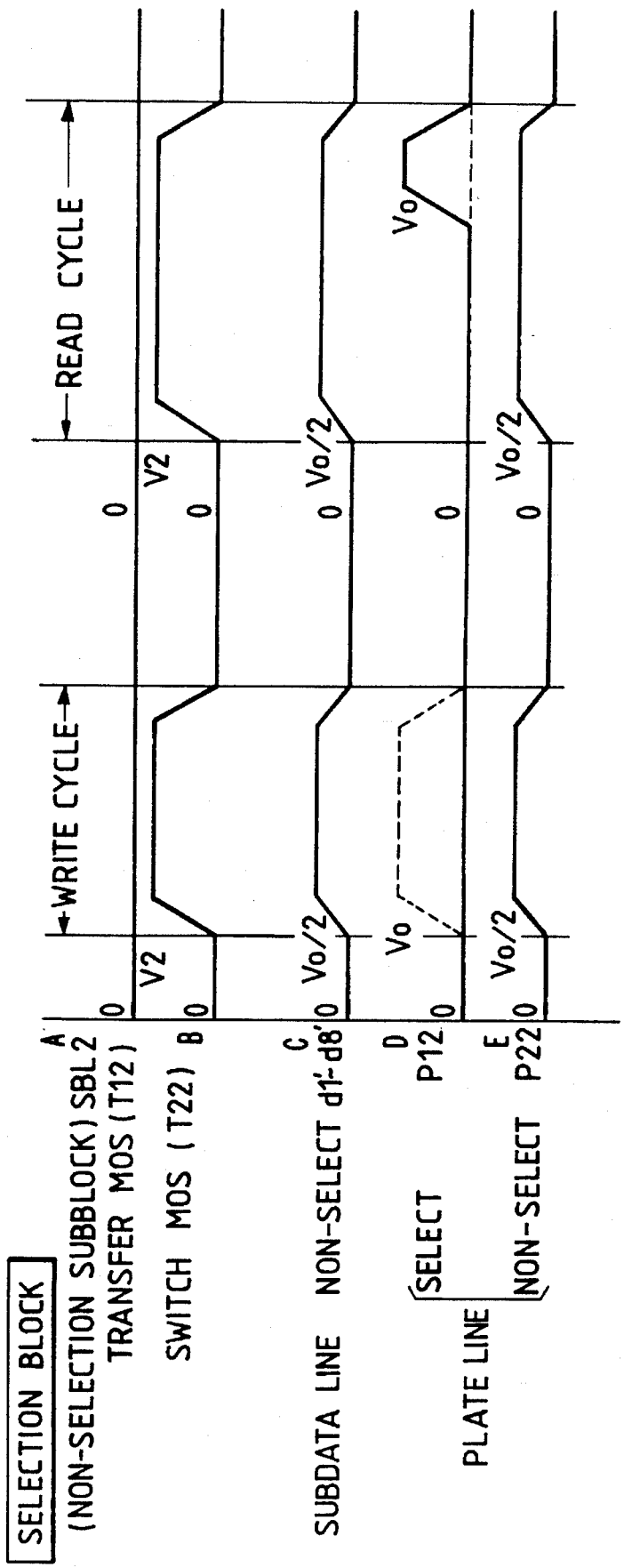
FIG. 7 is a schematic waveform chart for describing writing and reading operations executed by a non-selection subblock in the selection block employed in the semiconductor memory device shown in FIGS. 2 and 3.

FIG. 7 is a schematic waveform chart for describing writing and reading operations executed by the non-selection subblock SBL2 in the selection block. During write and read cycles, a transfer MOSFET T12 for electrically connecting a data line to a main data line is brought into an OFF state and a transfer MOSFET T22 for electrically connecting the data line to a stress-preventive voltage supply line is brought into an ON state. As a result, a voltage of Vo/2 is applied to each of data lines d1" through d8". Others are similar to those shown in FIG. 6. By sharing plate lines, a voltage of Vo is applied even in the case of the non-selection subblock SBL2 when a data re-writing process is executed according to the inversion of data by either writing or reading. Since, however, the voltage of Vo/2 is applied to each of the data lines d1" through d8" as described above, the reversal of polarization is not developed.

A process of determining a state corresponding to data 0, for example, as an erased state, executing data erasing/writing processing so that the direction of polarization is brought to the direction of polarization corresponding to the data 0 upon writing and thereafter writing only a state brought to data 1 may be carried out in addition to a process of specifying the above voltage applying direction according to data 1 and 0 to thereby execute data writing processing. Namely, a process of bringing all the bits into 0, i.e., an erased state upon writing data in a 8-bit unit in a manner similar to a rewriting operation of a conventional batch erasing EPROM or the like and writing only bits of 8 bits, which change from 0 to 1, may be executed. In doing so, the polarity of each of voltages supplied to the main data lines and the plate lines can be regularly set.

Namely, a block word line electrically connected to the gate of each of the transfer MOSFETs is maintained at a selected potential during a first erase period and a second write period. When "0" is written during the first erase period, the potential at a selected plate line changes from a non-selected level of Vo/2 to a selected level of 0 V. In synchronism with such a level change, the potential at a data line changes from a non-selected level of Vo/2 to a write voltage of Vo. Thus, the voltage of Vo is applied to a selected ferroelectric capacitor so that the polarization takes one direction.

When "1" is subsequently written during the second write period, the potential at a selected second word line changes from 0 V to Vo and the potential at a data line changes from Vo to 0 V. As a result, a write voltage Vo opposite in polarity to the above voltage is applied to a selected ferroelectric capacitor so that the polarization takes other direction.

Figure 8:
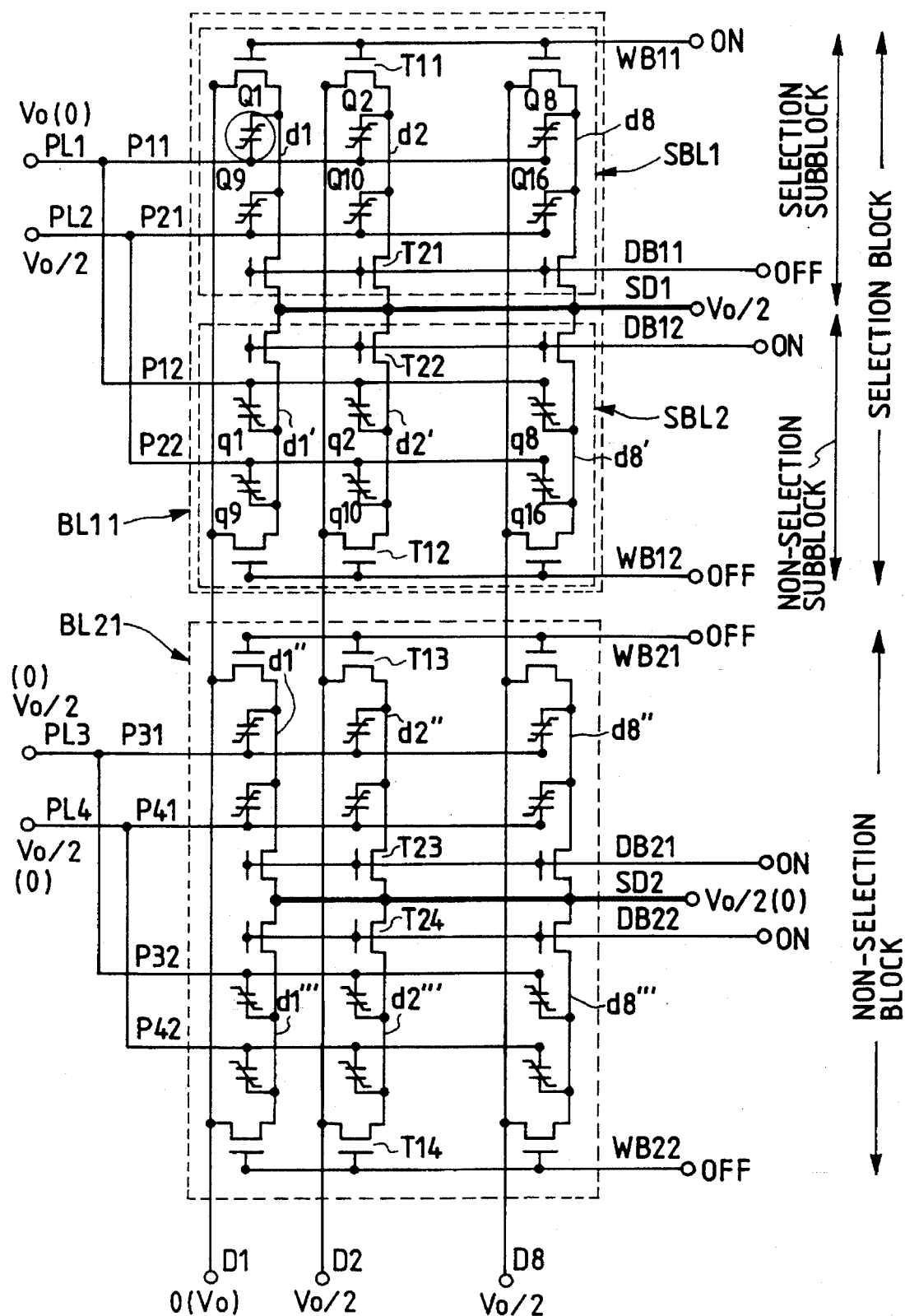
FIG. 8 is a circuit diagram for describing another example of the method of writing the data into the semiconductor memory device according to the present invention and reading it therefrom.

FIG. 8 is a circuit diagram for describing another example of a method of writing data into the above semiconductor memory device and reading it therefrom. In the same drawing, both a selection block BL11 and a non-selection block BL21 are shown as representatives by way of illustrative example in a manner similar to the example shown in FIG. 4.

Another example of a method of applying a bias on the non-selection block BL21 side is shown in the present example. Since a bias applying method on the selection block BL11 side is identical to that described in the example of FIG. 4, its description will be omitted. For example, switches MOSFETs T23 and 24 corresponding to a stress-preventive voltage supply line SD2, which are provided on the non-selection block BL21 side, are turned ON so that an intermediate voltage of Vo/2 is supplied to one ends of source-to-drain paths of the switches MOSFETs T23 and T24. Correspondingly, each of plate voltages is also changed from the above 0 V to Vo/2 equal to that applied to each of data lines d1" through d8" in the non-selection block BL21. Alternatively, 0 V is supplied to the stress-preventive voltage supply line SD2 in the non-selection block BL21 and each plate voltage may also be set to 0 V correspondingly. Since the same bias voltage is supplied to both electrodes of each of ferroelectric capacitors in the non-selection block BL21 without specially providing a discharge circuit for each of the data lines d1" through d8" as described above owing to such a structure, stresses placed on non-selected ferroelectric capacitors can be minimized.

Figure 9:
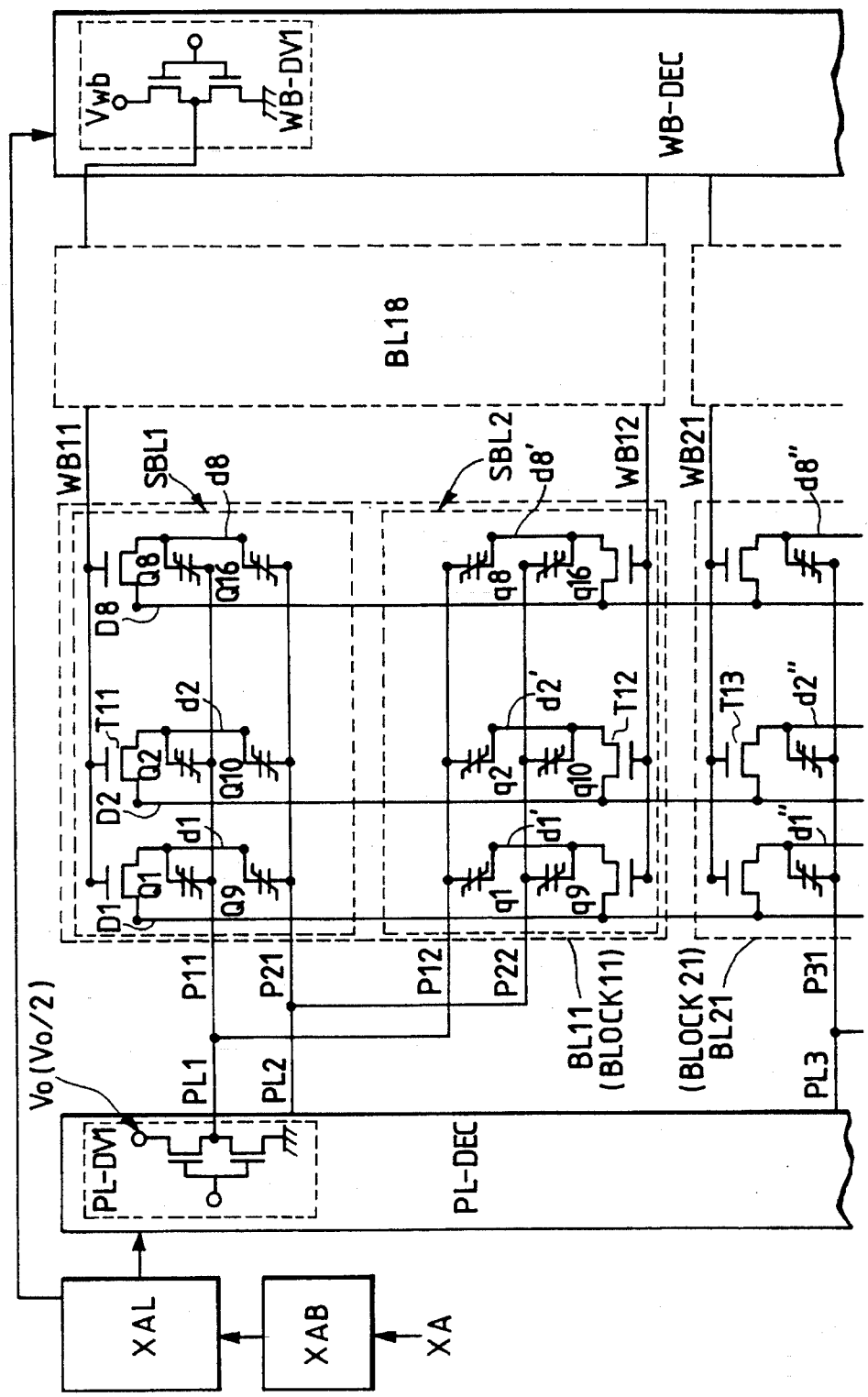
FIG. 9 is a partial block diagram showing another embodiment of a semiconductor memory device according to the present invention.
Figure 10:
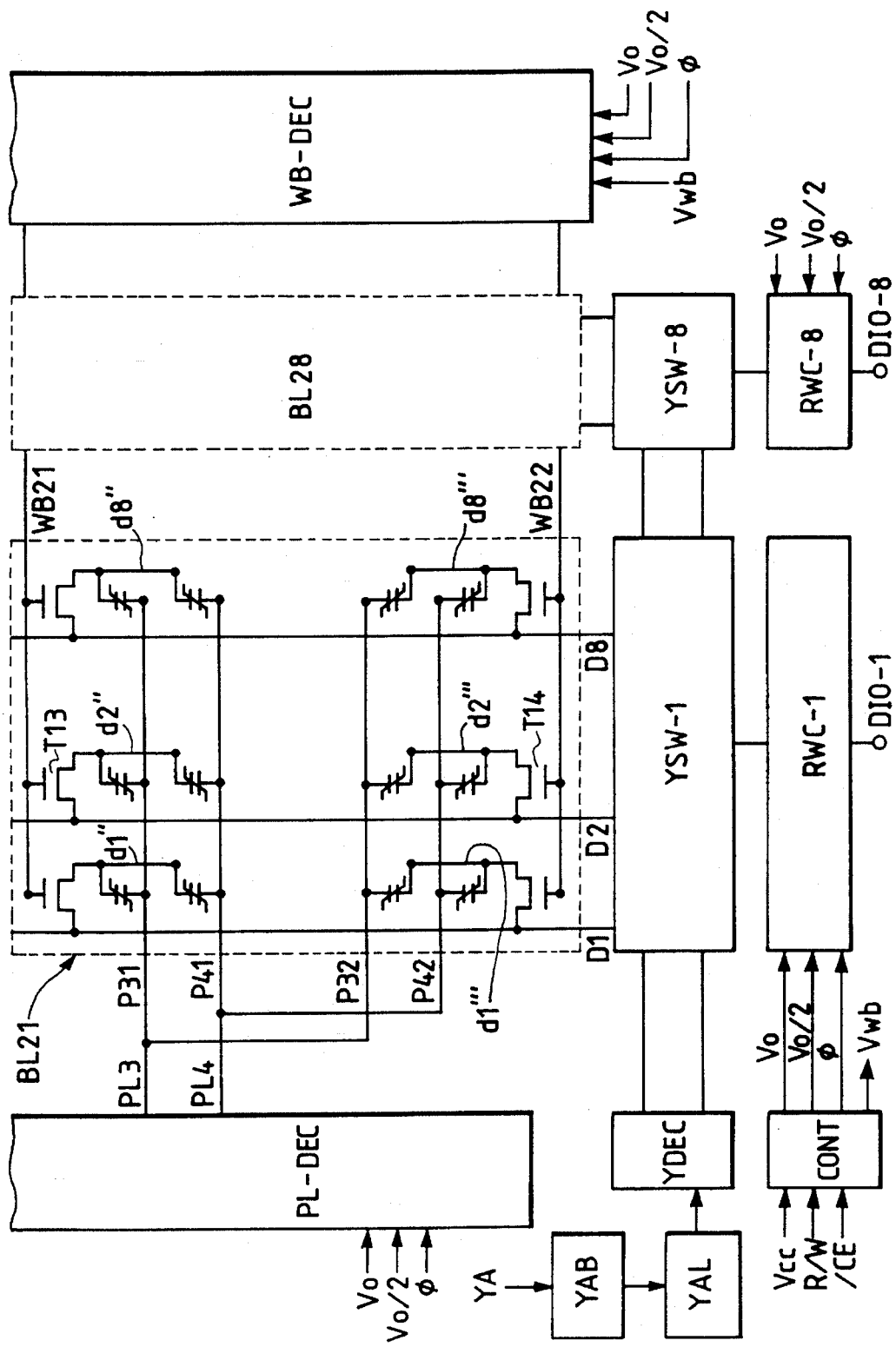
FIG. 10 is a residual partial block diagram showing the embodiment shown in FIG. 9.

FIG. 9 is a partial block diagram showing another embodiment of a semiconductor memory device according to the present invention. FIG. 10 is a residual partial block diagram showing the embodiment shown in FIG. 9. To make clear a relation between FIGS. 9 and 10, FIG. 9 is drawn so as to partially overlap with FIG. 10.

In the present embodiment, a stress-preventive voltage supply line and switches MOSFETs provided so as to correspond to the stress-preventive voltage supply line are omitted. Namely, a single memory block BL11 is divided into two subblock memory circuits SBL1 and SBL2. Plate electrodes P11 and P12 and P21 and P22 are respectively shared between the two subblock memory circuits SBL1 and SBL2. Further, the pitch of a common plate line driver corresponding to these plate electrodes is enlarged. Other structures are similar to the embodiment shown in FIGS. 2 and 3.

Since switches MOSFETs for electrically connecting the stress-preventive voltage supply line to data lines in a subblock can be omitted owing to this structure, each circuit can be greatly simplified.

Figure 11:
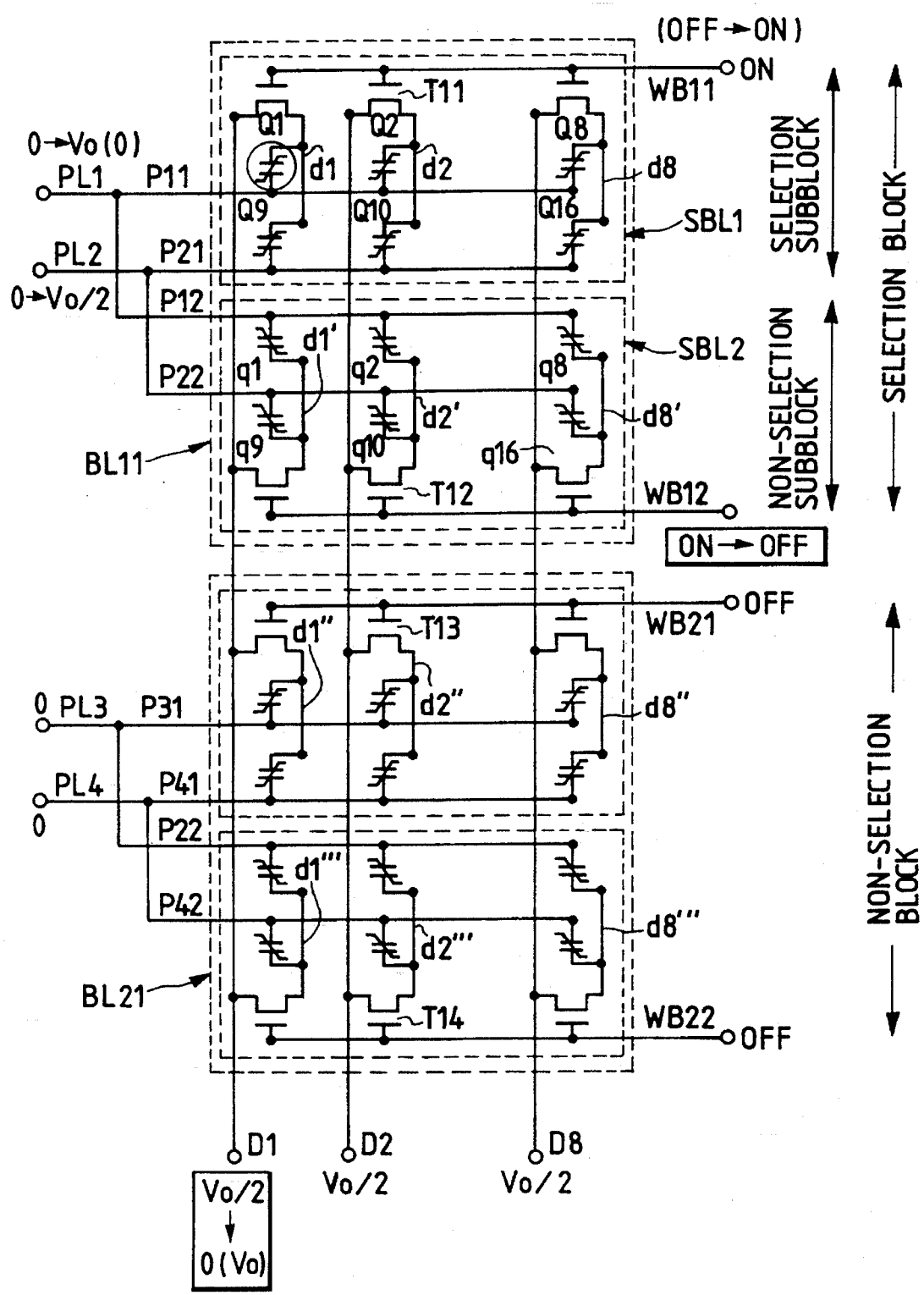
FIG. 11 is a circuit diagram for describing one example of a method of writing data into the semiconductor memory device shown in FIGS. 9 and 10 and reading it therefrom.

FIG. 11 is a circuit diagram for describing one example of a method of writing data into the semiconductor memory device shown in FIGS. 9 and 10 and reading it therefrom. In the same drawing, both a selection block BL11 and a non-selection block BL21 are shown as representatives by way of illustrative example. Similarly to above, the voltage for developing the reversal of polarization in a ferroelectric capacitor Q1 or the like will be set as Vo and the reversal of polarization will not be produced under a voltage Vo/2 corresponding to half the voltage Vo.

Since the stress-preventive voltage supply line and the switches MOSFETs are omitted to simplify the circuits as described above in the present embodiment, functions corresponding to these components are executed in accordance with an operating sequence. Namely, a precharge period is set prior to either a writing operation or a reading operation. During the precharge period, a word block line WB11 of a selection subblock in the selection block is set to a low level so that switches MOSFETs T11 and the like are turned OFF. Further, a block word line WB12 of a non-selection subblock SBL2 is set to a high level so that switches MOSFETs T12 and the like are turned ON. Next, main data lines D1 through D8 are all brought into a non-selected state so as to be supplied with Vo/2. Thus, each of data lines d1' through d8' in the non-selection subblock is precharged to Vo/2.

When the precharge operation is completed, the switches MOSFETs T11 and the like of the selection subblock memory circuit SBL1 in the selection block BL11 are turned ON and switches MOSFETs T12 are turned OFF. As a result, data lines d1 through d8 in the selection subblock memory circuit SBL1 are respectively electrically connected to the main data lines D1 through D8. On the other hand, each of the data lines d1' through d8' in a non-selection subblock memory circuit SBL2 is maintained at Vo/2 in a manner similar to the embodiment shown in FIG. 4. A difference between FIGS. 4 and 11 is that the data lines d1' through d8' are steadily supplied with the voltage of Vo/2 through the stress-preventive switches MOSFETs in the embodiment shown in FIG. 4, whereas electric charges are held by parasitic capacitors parasitically coupled to the data lines d1' through d8' so that the data lines d1' through d8' are maintained at Vo/2 in the embodiment shown in FIG. 11.

Further, the main data line D1 is selected from the main data lines D1 through D8 so as to be supplied with a write or read signal 0 (or Vo). The remaining non-selected main data lines D2 through D8 are supplied with Vo/2. When a plate electrode P11 is selected in the selection subblock memory circuit SBL1 and a data writing or reading process is effected on a ferroelectric capacitor Q1, the voltage Vo (or 0) is supplied to a common plate line PL1 and other non-selected common plate line PL2 is changed from 0 to Vo/2.

Thus, the voltage Vo is applied between both electrodes of the ferroelectric capacitor Q1 of the selection subblock memory circuit SBL1 so that the reversal of polarization can be made. If the direction of polarization referred to above is equal to the direction of polarization in a state of retention of data by the ferroelectric capacitor Q1, its condition is of course maintained by the ferroelectric capacitor Q1. On the other hand, since only the voltage Vo/2 is applied between both electrodes of each of non-selected ferroelectric capacitors Q2 through Q8 respectively provided between the selected plate electrode P11 and the non-selected data lines d2 through d8, the original condition of polarization is maintained as it is. Since only the voltage Vo/2 is applied to a ferroelectric capacitor Q9 provided between the selected data line d1 and a non-selected plate electrode P12 in the same manner as described above, the original condition of polarization is held as it is. In the case of ferroelectric capacitors Q10 through Q16 each provided between each of the non-selected data lines d2 through d8 and the non-selected plate electrode P21, the voltage applied between both electrodes of each ferroelectric capacitor becomes equal to Vo/2. As a result, the reversal of polarization is not developed and a voltage of Vo/2 that causes stresses is not applied to both electrodes of each ferroelectric capacitor either.

The switches MOSFETs T12 and the like of the non-selection subblock memory circuit SBL2 in the selection block BL11 are maintained at the above state and turned OFF so that the data lines d1' through d8' are held at Vo/2. Thus, since only a voltage of Vo/2 is applied to each of ferroelectric capacitors each having the plate electrode P12 supplied with a voltage of Vo (or 0) by making commonality of the plate electrodes P11 and P12, the reversal of polarization is not developed. In the case of ferroelectric capacitors each constructed by each of the non-selected data lines d1' through d8' and a non-selected plate electrode P22, the voltage applied between both electrodes of each ferroelectric capacitor becomes equal to Vo/2. As a result, the reversal of polarization is not developed and a voltage of Vo/2 that causes stresses is not applied to each ferroelectric capacitor either.

In the non-selection block BL21, switches MOSFETs T13 and T14 and the like are respectively brought into an OFF state when the main data lines D1 through D8 and the word block lines WB21 and WB22 are rendered low in level. Thus, data lines d1" through d8" and the like in the non-selection block BL21 are discharged to 0 V by an unillustrated discharge circuit although not subjected to particular restrictions, and only 0 V is applied to each of plate electrodes P31 through P42. Therefore, no polarization is produced and the voltage that causes stresses is not applied either.

Figure 12:
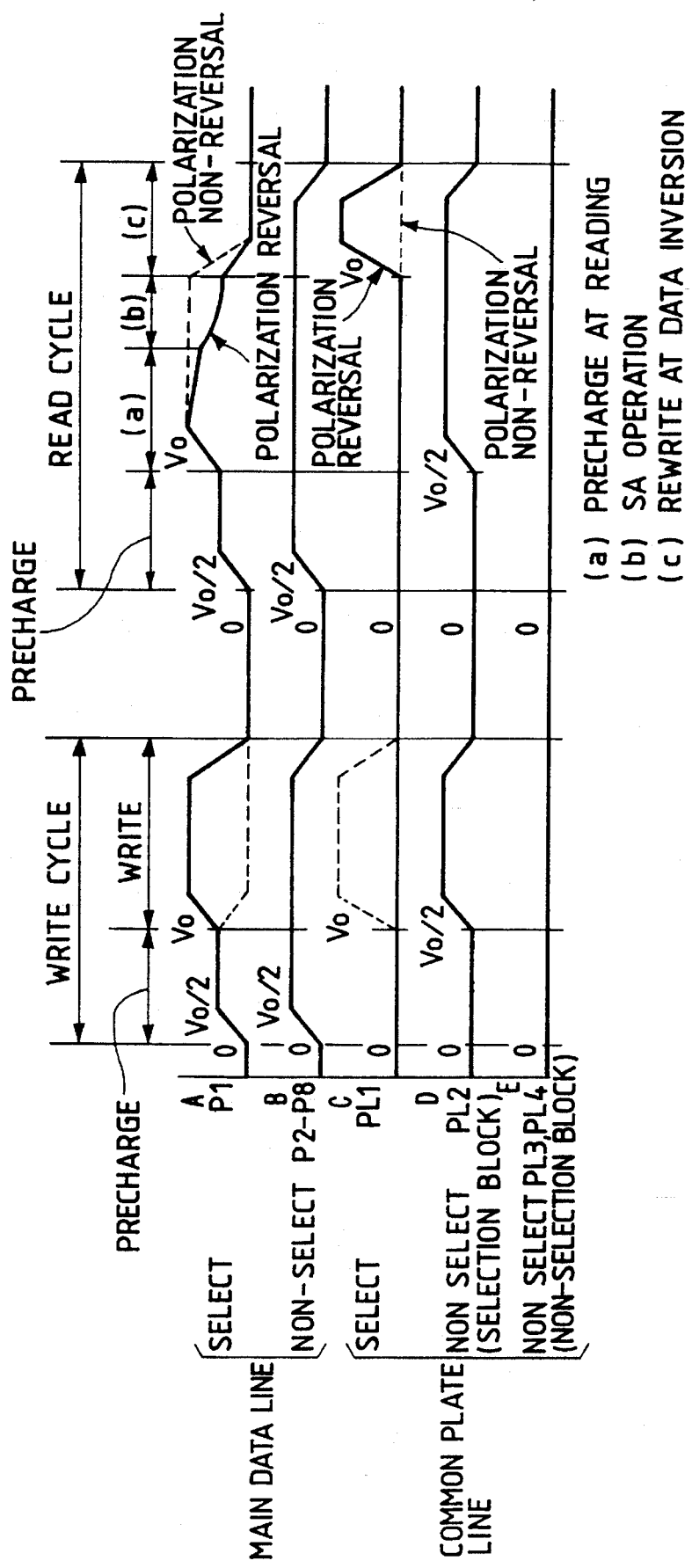
FIG. 12 is a schematic waveform chart for describing writing and reading operations of the semiconductor memory device shown in FIGS. 9 and 10.

FIG. 12 is a schematic waveform chart for describing writing and reading operations executed by the embodiment shown in FIG. 11. During a write cycle, a precharge period is set and such a Vo/2 precharge operation as described above is performed. When such a precharge period is terminated, Vo indicated by a solid line (or 0 V indicated by a dotted line) is supplied to a main data line selected from main data lines in the same manner as described above. On the other hand, Vo/2 is supplied to non-selected main data lines. 0 V indicated by a solid line (or Vo indicated by a dotted line) is supplied to a common plate line selected from common plate lines contrary to the voltage supplied to the main data line selected from the main data lines. Further, a plate voltage applied to a non-selected common plate line in the selection block is set to Vo/2, whereas plate voltages applied to non-selected common lines in the non-selection block are set to 0 V.

During a read cycle, a precharge period is provided and a Vo/2 precharge operation similar to the above is performed. When such a precharge period is completed, a main data line selected from the main data lines is precharged to Vo for an (a) period as indicated by a solid line in the same manner as described above and a plate voltage is set to 0 V. Therefore, the reversal of polarization is developed in the selected main data line. Thus, current, which flows incident to the occurrence of polarization, is sensed by a sense amplifier for a (b) period. Namely, a change in potential corresponding to the movement of charges due to the reversal of polarization appears in a corresponding data line and is sensed by the sense amplifier. On the other hand, a data line connected with a ferroelectric capacitor in which the reversal of polarization is not performed, does not cause a potential change. To return the reversal of polarization developed during the read cycle to the original state, the voltage supplied to the main data line selected as indicated by a (c) period and the voltage applied to the plate electrode are reversely set contrary to the read cycle. If the non-inversion of polarization takes place as indicated by a dotted line, the voltage applied to the main data line and the voltage applied to the plate electrode are both brought to 0 V. Thus, this state is held as it is. Even during the read cycle, voltages supplied to each of non-selected main data lines and each of plate electrodes are processed in a manner similar to the above write cycle.

Figure 13:
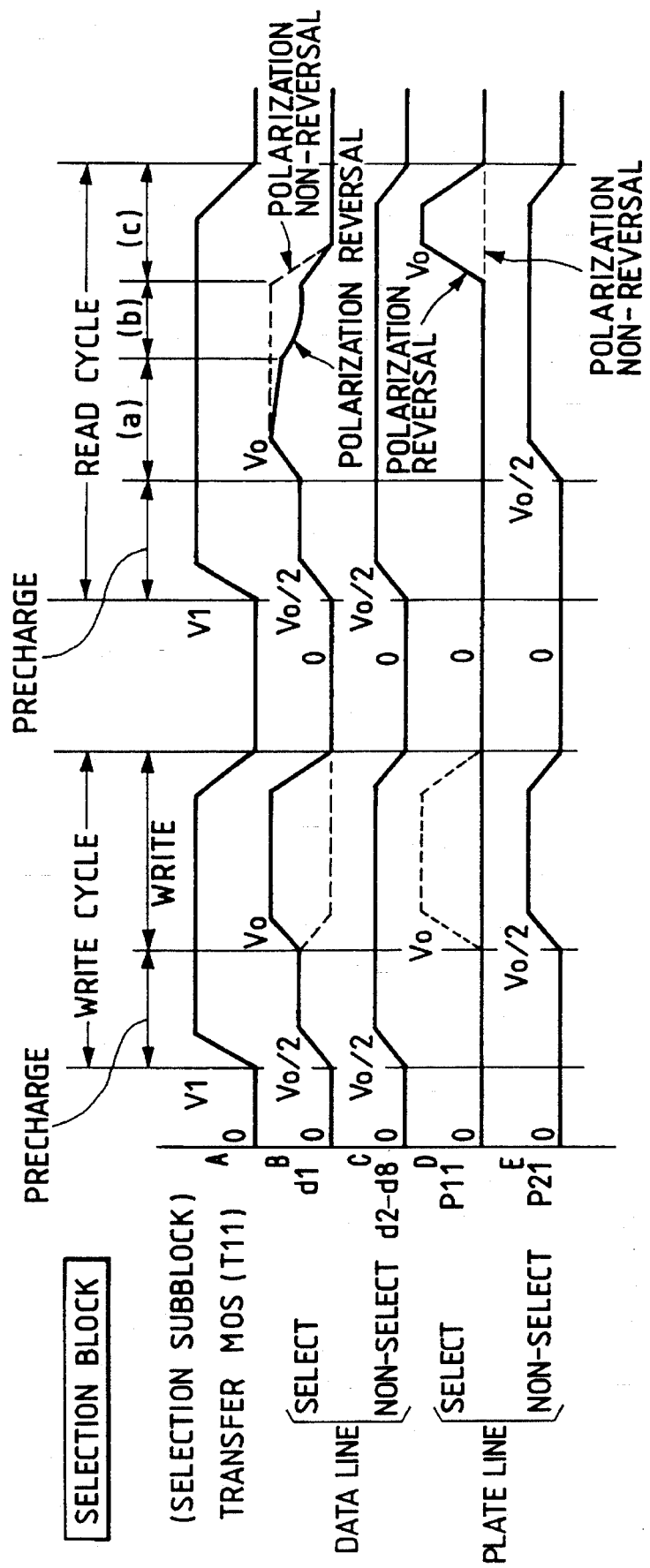
FIG. 13 is a schematic waveform chart for describing writing and reading operations executed by a selection subblock in a selection block employed in the semiconductor memory device shown in FIGS. 9 and 10.

FIG. 13 is a schematic waveform chart for describing writing and reading operations executed by the selection subblock memory circuit SBL1 in the selection block BL11. During a write cycle, a precharge period is set and a Vo/2 precharge operation similar to the above is performed as described above. When such a precharge period is terminated, a transfer MOSFET T11 for electrically connecting a data line to a main data line is brought into an ON state in the same manner as described above. As a result, a voltage Vo (or 0 V) for the selected main data line is applied to a selected data line d1 and a voltage Vo/2 for each of non-selected main data lines is applied to each of other non-selected data lines d2 through d8. Voltages applied to plate lines are similar to those shown in FIG. 12. Thus, a voltage Vo is applied to a ferroelectric capacitor formed between the selected data line d1 and the selected plate line P11. Only a voltage of Vo/2 is applied to other ferroelectric capacitors.

During a read cycle, a precharge period is provided and a Vo/2 precharge operation is performed as described above. When such a precharge period is completed, the transfer MOSFET T11 for electrically connecting the data line to the main data line is turned ON as described above. Therefore, the selected data line d1 is precharged to Vo for an (a) period as indicated by a solid line. Since the voltage applied to a plate electrode is set to 0 V, the reversal or inversion of polarization is developed in the selected data line. Thus, current, which flows incident to the occurrence of polarization, is sensed by a sense amplifier for a (b) period. To return the reversal of polarization developed during the read cycle to the original state, the voltage supplied to the main data line selected as indicated by a (c) period and the voltage applied to the plate electrode are reversely set contrary to the read cycle. If the non-reversal of polarization takes place as indicated by a dotted line, the voltage applied to the main data line and the voltage applied to the plate electrode are both brought to 0 V. Thus, this state is held as it is. Even during the read cycle, voltages supplied to non-selected main data lines and plate electrodes are processed in a manner similar to the above write cycle.

Figure 14:
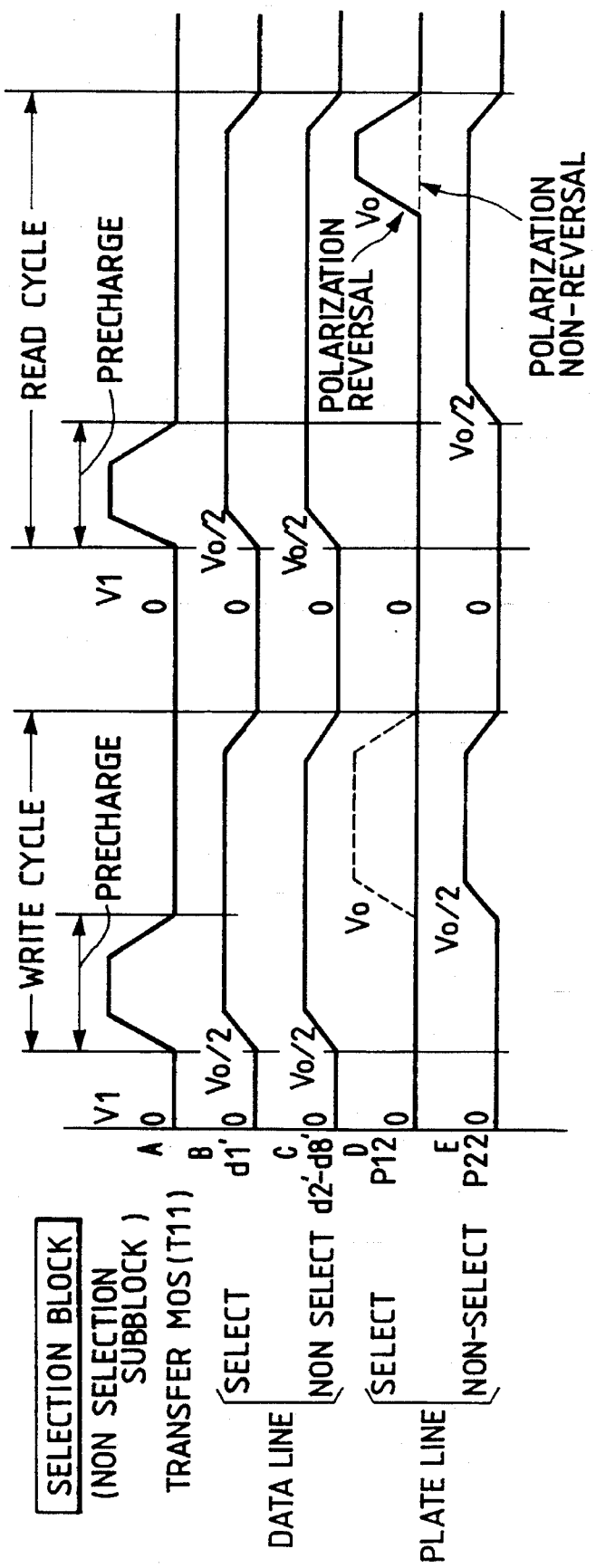
FIG. 14 is a schematic waveform chart for describing writing and reading operations executed by a non-selection subblock in the selection block employed in the semiconductor memory device shown in FIGS. 9 and 10.

FIG. 14 is a schematic waveform chart for describing writing and reading operations executed by the non-selection subblock memory circuit SBL2 in the selection block BL11. During write and read cycles, precharge periods are set and Vo/2 precharge operations are performed as described above. When such precharge periods are ended, a transfer MOSFET T12 for electrically connecting a data line to a main data line is brought into an OFF state. Owing to the above precharge, Vo/2 is held at each of data lines d1" through d8". Others are similar to those shown in FIG. 13. By sharing plate lines, a voltage of Vo is applied even in the case of the non-selection subblock memory circuit SBL2 when a data re-writing process is executed according to the inversion of data by either writing or reading. Since, however, the voltage of Vo/2 is applied to each of the data lines d1" through d8" as described above, the reversal of polarization is not developed.

Figure 15:
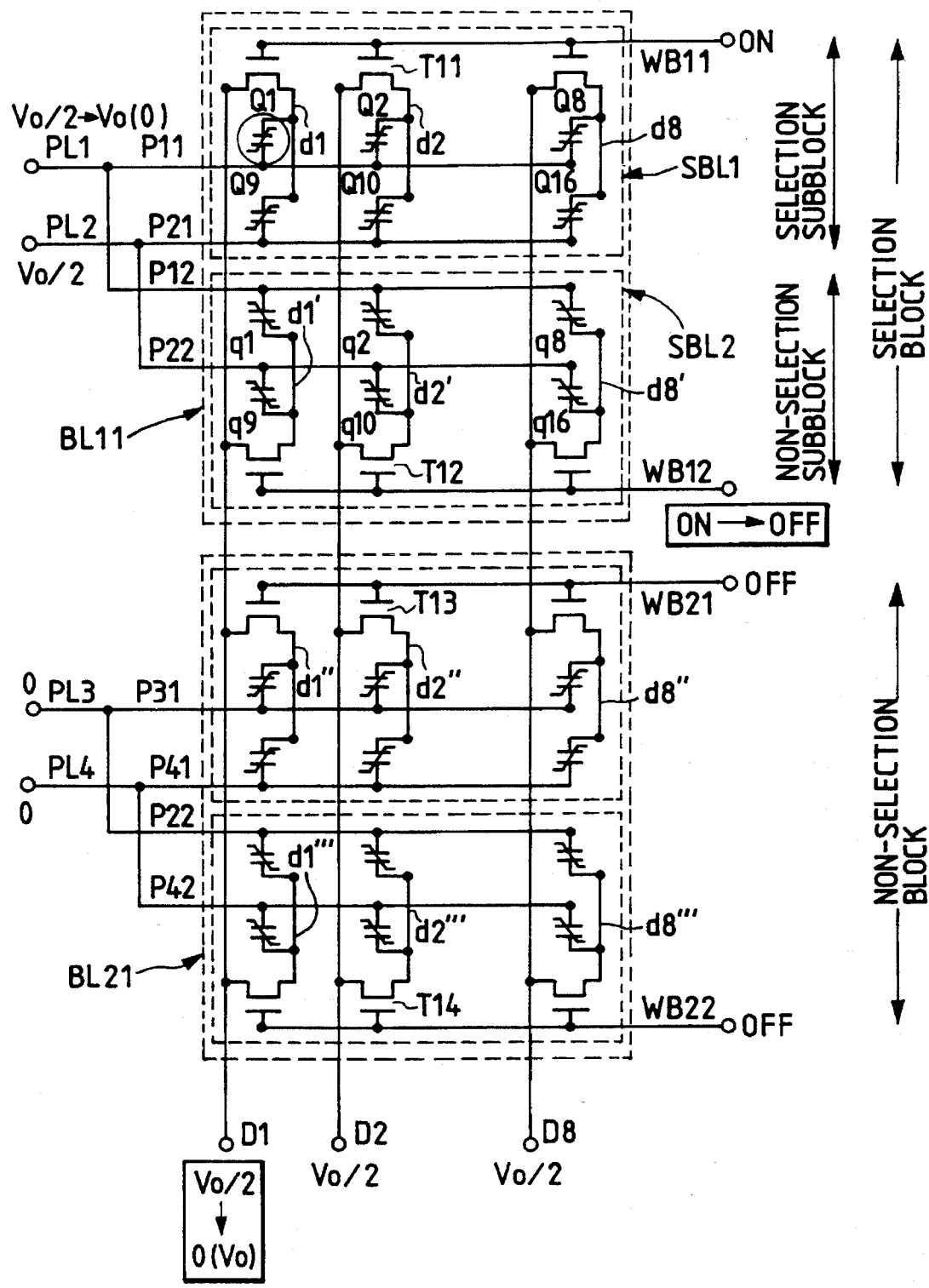
FIG. 15 is a circuit diagram for describing another example of the method of writing the data into the semiconductor memory device shown in FIGS. 9 and 10 and reading it therefrom.

FIG. 15 is a circuit diagram for describing another example of a method of writing data into the semiconductor memory device shown in FIGS. 9 and 10 and reading it therefrom. In the same drawing, both a selection block BL11 and a non-selection block BL21 are shown as representatives by way of illustrative example. Similarly to above, the voltage for causing the reversal of polarization in a ferroelectric capacitor Q1 or the like will be set as Vo and the reversal of polarization will not be produced under a voltage Vo/2 corresponding to half the voltage Vo.

In the present example, a word block line WB11 of a selection subblock memory circuit SBL1 of a selection block BL11 is rendered high in level even during a precharge period in a manner similar to a word block line WB12 of a non-selection subblock memory circuit SBL2 so that switches MOSFETs T11 and T12 are both turned ON. Thus, main data lines D1 through D8 are all non-selected and supplied with Vo/2. Further, data lines d1 through d8 and data lines d1' through d8' in the selection block are precharged to Vo/2.

When the above-described precharge is completed, switches MOSFETs T12 and the like of the non-selection subblock memory circuit SBL2 in the selection block BL11 are turned OFF so that the data lines d1' through d8' of the non-selection subblock memory circuit SBL2 hold Vo/2. Others are similar to those shown in FIG. 11 and their description will therefore be omitted. Since the word block line WB11 of the selection subblock memory circuit SBL1 in the selection block BL11 may be rendered high in level over a memory cyclic time, the semiconductor memory device can easily be controlled in the case of such a structure.

Now, consider Vo/2 stresses that are exerted on ferroelectric capacitors to be non-selected upon execution of a memory access. The non-selected voltage Vo/2 does not cause the direct reversal of polarization with respect to the ferroelectric capacitor. When, however, the number of times in which the polarization reversal takes place, increases or a polarization reversal time is made longer, such a voltage cannot be neglected. Thus, holding characteristics of residual polarization on hysteresis characteristics indicative of relationship between the polarization and electric fields held by the ferroelectric capacitor are degraded.

If Vo/2 stresses developed at the time that a memory array having a storage capacity of about 1 Mbit in total is considered and a writing or reading process is effected on all the bits once under the condition that, for example, m (eight) ferroelectric capacitors are electrically connected to one switch element, the number of data lines is set as N (128 data lines) and the number of plate electrodes is set as 1024 as in the case of the semiconductor memory device according to the present embodiment, are calculated, then the result of calculation is represented in Table 1 shown below.

TABLE 1

| | word line/ data line | present invention | prior art 1 | prior art 2 | prior art 3 |
|---|---|---|---|---|---|
| selection block | select/non-select | N − 1 | N − 1 | N − 1 | N − 1 |
| | non-select/select | m − 1 | M − 1 | 0 | m − 1 |
| | non-select/non-select | 0 | NM − 1 | 0 | |
| non-selection block | select/non-select | | | | |
| | non-select/select | | | | |
| | non-select/non-select | 0 | | | N · m (M/m − 1) |

Conventional semiconductor memory devices are shown in Table 1 for comparison with the present invention. Namely, a semiconductor memory device in which ferroelectric capacitors are respectively provided at points where data lines and word line intersect, without providing switching elements, is regarded as a prior art (prior art 1) as disclosed in Japanese Patent Laid-Open No. 4-336477, a semiconductor memory device in which a single switch is provided with respect to a single ferroelectric capacitor, is regarded as a prior art (prior art 2) as disclosed in Japanese Patent Laid-Open No. 3-36763, and a semiconductor memory device in which a plurality of ferroelectric capacitors are provided with respect to a single switch and Vo/2 is steadily supplied as a non-selected level although not apparent from the publication, is regarded as a prior art (prior art 3) as disclosed in Japanese Patent Laid-Open No. 4-90189.

The number of times in which the maximum stress takes place is represented in accordance with the following equations (1) through (4). The maximum stress in the present invention $$= (N-1) + (m-1) \quad (1)$$

The maximum stress in the prior art $1 = NM-1$ (2)

The maximum stress in the prior art $2 = N-1$ (3)

The maximum stress in the prior art $3 = 1+(m-1)/(N-1)+Nm/(N-1)\cdot(M/m-1)$ (4)

Maximum stress ratios of the present invention, the prior art 1 and the prior art 3 relative to the prior art 2 are represented in accordance with the following equations (5) through (7).

Relative ratio of the present invention $=1+(m-1)/(N-1)$ (5)

Relative ratio of the prior art $1=(NM-1)/(N-1)$ (6)

Relative ratio of the prior art $3 =1+(m-1)/(N-1)+Nm/(N-1)\cdot(M/m-1)$ (7)

The relative ratio of the present invention at the time that N=128, M=1024 and m=8 as described above is about one time the relative ratio of the prior art 2. Further, the relative ratio of the present invention reaches 1.06 times the relative ratio of the prior art 2 and the relative ratio of each of the prior arts 1 and 3 reaches 1025 times the relative ratio of the prior art 2. Thus, in the present invention, the stress of Vo/2, which is exerted on a ferroelectric capacitor non-selected upon execution of a memory access, can be set in a manner substantially similar to the prior art 2 in which one switch is provided with respect to one capacitor, while high integration is being made by providing the plurality of ferroelectric capacitors with respect to the single switch. When the memory access is performed in a 8-bit unit, eight memory arrays each having a structure similar to the above are provided as a whole. Therefore, the storage capacity of the semiconductor memory device can be brought to a large storage capacity of about 8 Mbits.

Figure 16:
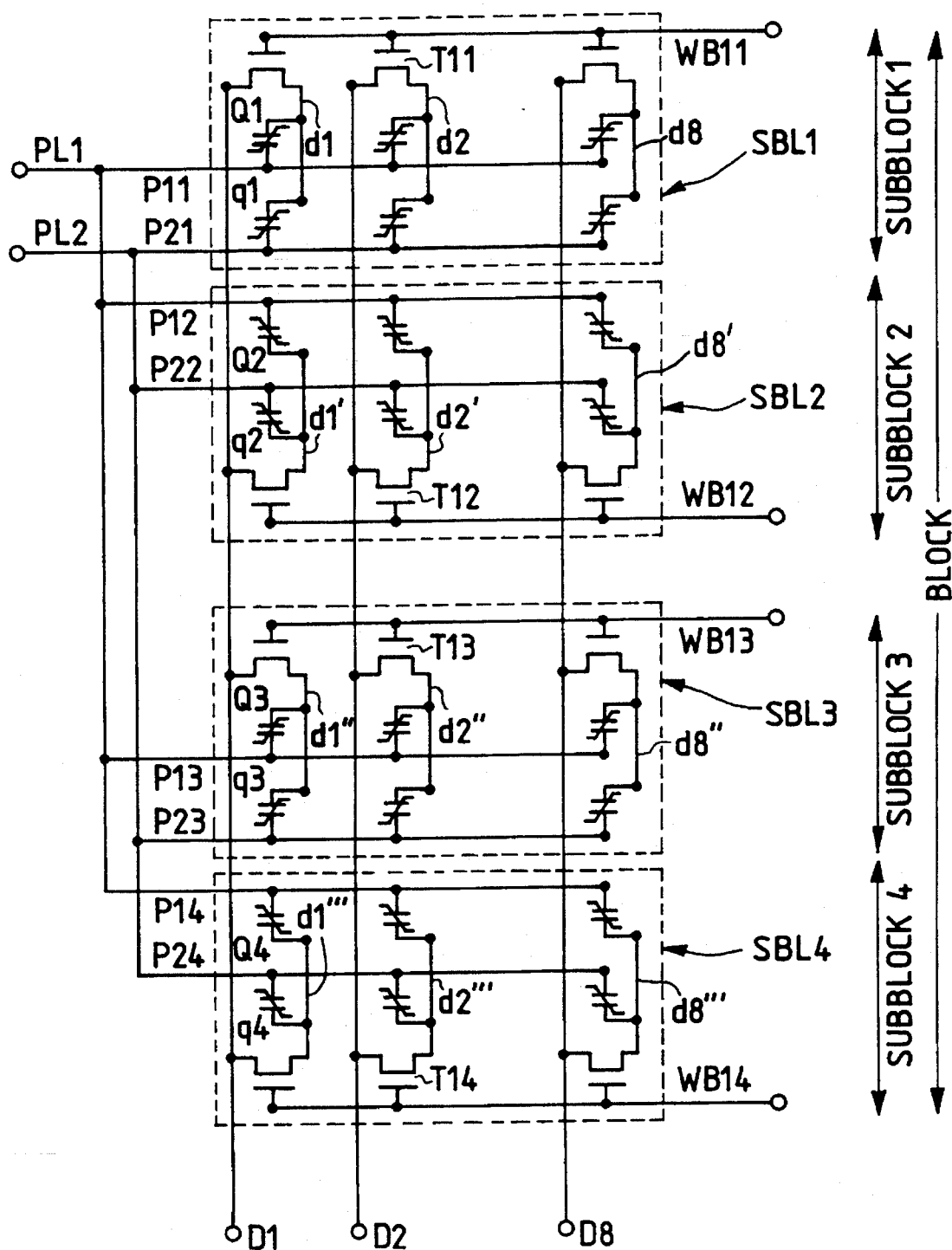
FIG. 16 is a circuit diagram showing one example of a memory array of a semiconductor memory device according to the present invention.

FIG. 16 is a circuit diagram showing one example of a memory array of a semiconductor memory device according to the present invention. In the example, four subblock memory circuits comprised of SBL1 through SBL4 are provided within a single block. Correspondingly, four plate electrodes P11, P12, P13 and P14 and P21, P22, P23 and P24 corresponding to the four subblock memory circuits SBL1 through SBL4 are respectively electrically connected to common plate lines PL1 and PL2.

Thus, the pitch of each common plate line driver can be made greater by increasing the number of the subblock memory circuits and hence a restriction imposed on a layout for forming a plate selection circuit is further relaxed.

A predetermined voltage that does not produce a stress of Vo/2, may be supplied without effecting the above precharge operation on data lines in a non-selection subblock by providing the stress-preventive voltage supply line and the switches MOSFETs employed in the first embodiment in the same drawing.

Figure 17:
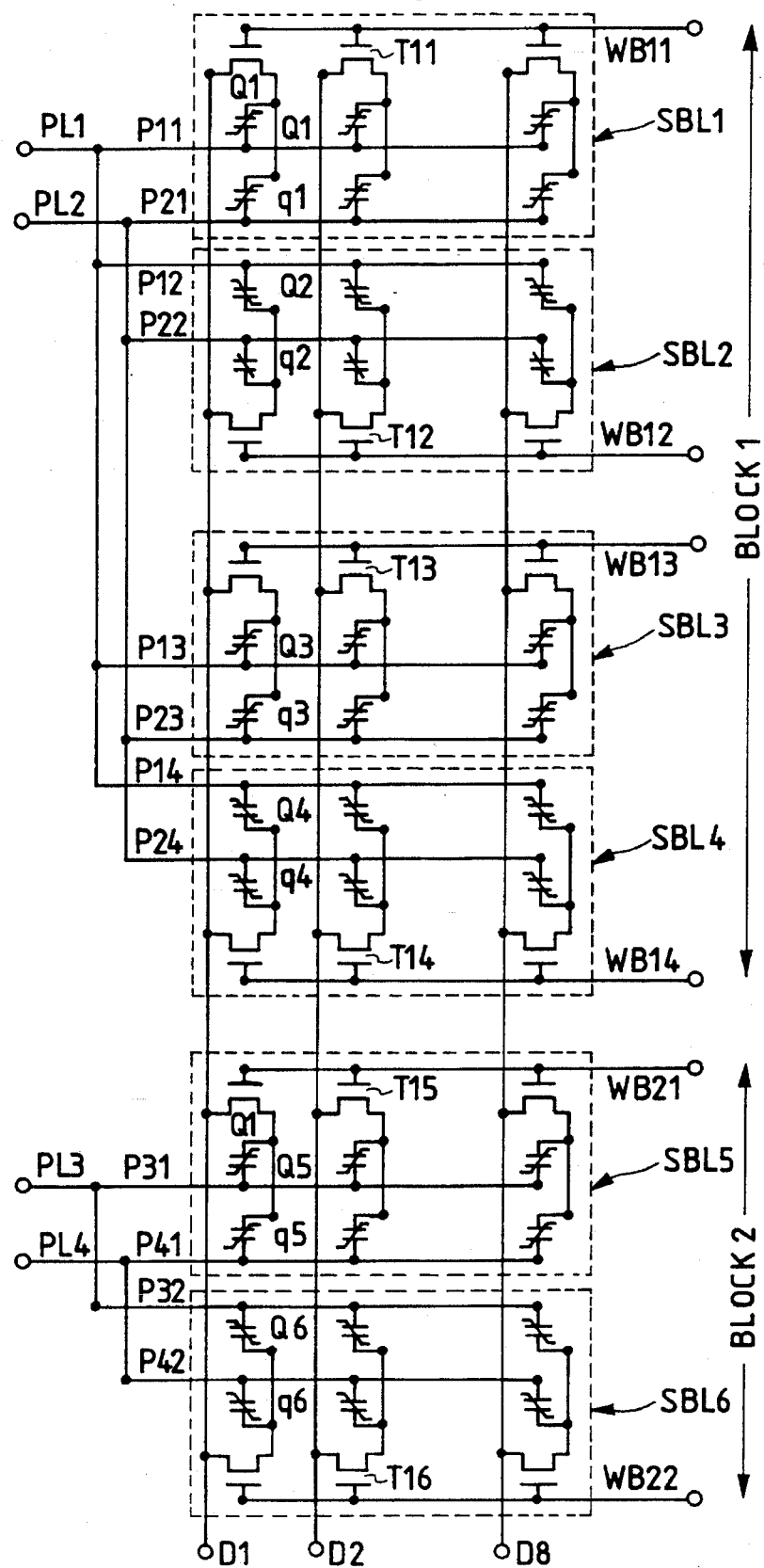
FIG. 17 is a circuit diagram illustrating another example of the memory array of the semiconductor memory device according to the present invention.

FIG. 17 is a circuit diagram illustrating another example of the memory array of the semiconductor memory device according to the present invention. In the present example, subblocks are different in number every blocks. Namely, four subblock memory circuits SBL1 through SBL4 are provided with respect to a block 1, whereas two subblock memory circuits SBL5 and SBL6 are provided with respect to a block 2.

Namely, respective plate electrodes of the four subblock memory circuits SBL1 through SBL4 are electrically connected to their corresponding common plate lines PL1 and PL2 in the block 1. Respective plate electrodes of the two subblock memory circuits SBL5 and SBL6 are electrically connected to their corresponding common plate lines PL3 and PL4 in the block 2.

In the semiconductor memory device according to the present invention, the memory access executed in a block unit is effective in that the stress with respect to each ferroelectric capacitor is minimized. This is because if combined or lumped data is written or read for each block, a direct voltage that develops the stress in each ferroelectric capacitor as described above can be prevented from being applied to a non-selection memory block as compared with the case where the memory access is performed bit by bit at intervals over blocks.

Namely, a deterioration in characteristics of each ferroelectric capacitor due to stresses can be reduced by effecting data writing and reading processes in a lumped data unit (sector) as in the case of a magnetic disc memory device and assigning the lumped data to a single memory block. In this case, it is convenient to incorporate a dynamic RAM or a static RAM or a register into the semiconductor memory device, taking externally written data in the RAM or register in this condition and writing the data into ferroelectric capacitors in block units in order. During the reading operation, the data read from the corresponding ferroelectric capacitor is transferred to either the RAM or the register from which a read signal is outputted at a high speed.

If the blocks in which the subblocks are different in number are provided as shown in FIG. 17 when two types of data comprised of a number of bits and data comprised of bits reduced in number as compared with the bits referred to above exist, memory cells in each block can effectively be used without avail by selecting the corresponding block according to the size of data where it is desired to write and read data in the block unit as described above.

Figure 18:
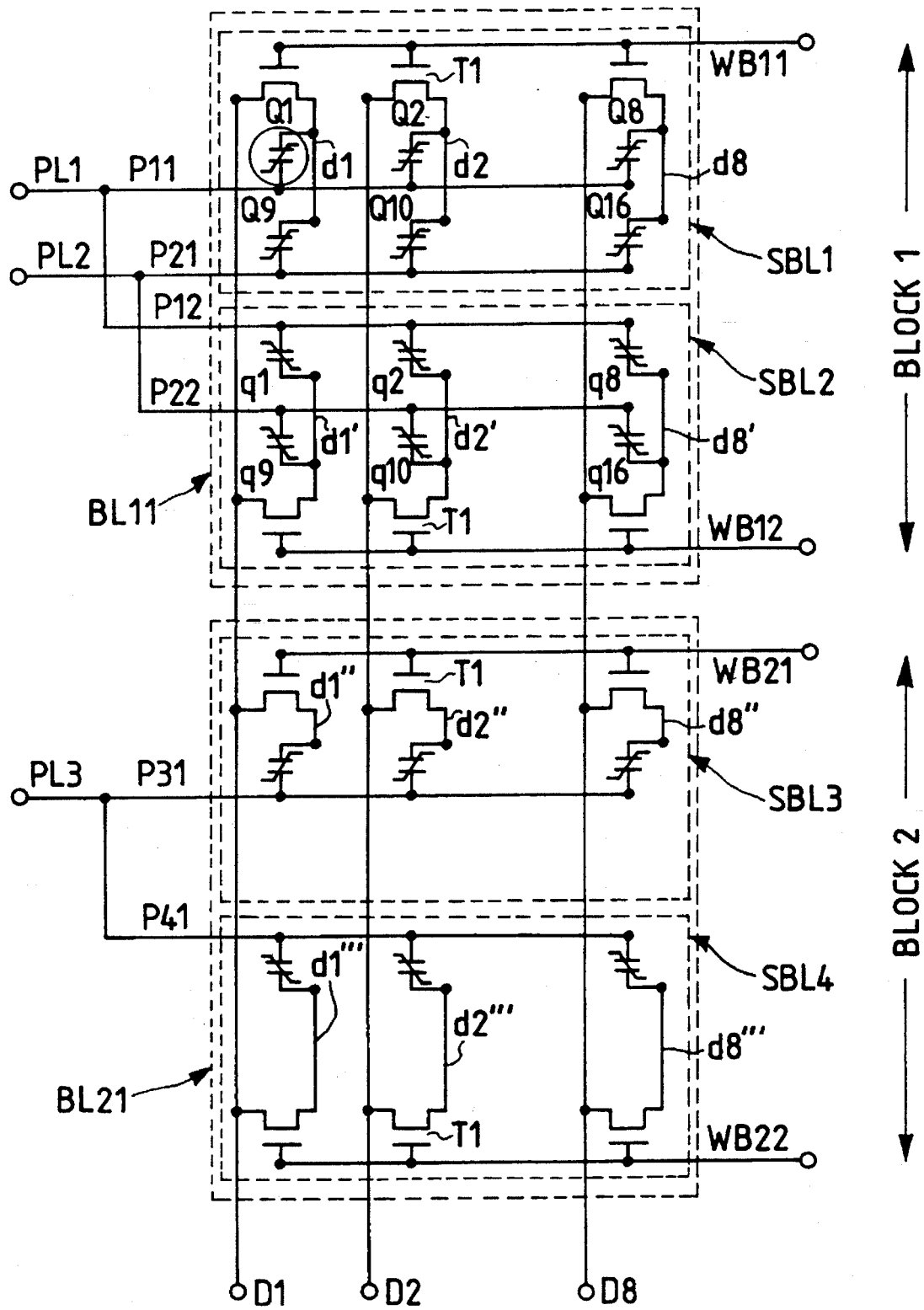
FIG. 18 is a circuit diagram depicting a further example of the memory array of the semiconductor memory device according to the present invention.

FIG. 18 is a circuit diagram showing a further example of the memory array employed in the semiconductor memory device according to the present invention. In the present example, subblock memory circuits are identical in number every blocks but plate electrodes are different in number every blocks. Namely, two ferroelectric capacitors are provided with respect to a single switch MOSFET in subblock memory circuits SBL1 and SBL2 of a block 1, whereas a single ferroelectric capacitor is provided with respect to a switch MOSFET in subblock memory circuits SBL3 and SBL4 of a block 2. Even in the case of such a structure, data can be made different in size every blocks in the same manner as described above.

Figure 19:
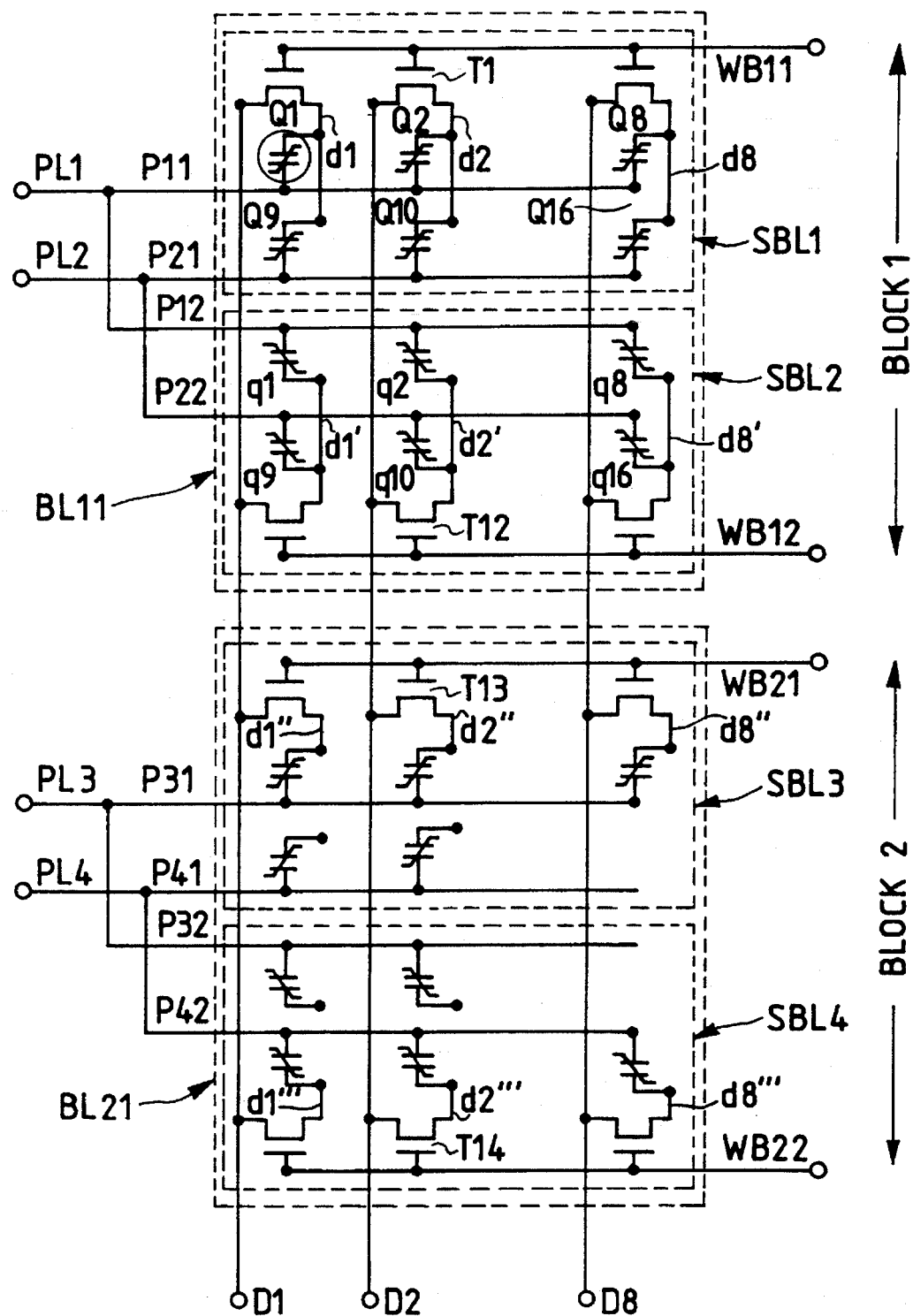
FIG. 19 is a circuit diagram showing a still further example of the memory array of the semiconductor memory device according to the present invention.

FIG. 19 is a circuit diagram illustrating a still further example of the memory array employed in the semiconductor memory device according to the present invention. In the present example, subblock memory circuits are identical in number every blocks but plate electrodes are made different in number every blocks. Namely, two ferroelectric capacitors are provided with respect to a single switch MOSFET in subblock memory circuits SBL1 and SBL2 of a block 1, whereas a single ferroelectric capacitor is provided with respect to a switch MOSFET in subblock memory circuits SBL3 and SBL4 of a block 2. Since the plate electrodes are different in density from each other between the blocks 1 and 2, dummy plate electrodes are provided to make a structure similar to the block 1.

Namely, the dummy plate electrodes are prevented from intersecting data lines in each block so that ferroelectric capacitors are not formed. Owing to the provision of such dummy plate electrodes, the dimensions of patterns can be prevented from varying due to non-dense and dense states of the patterns for the plate electrodes. Namely, since the above variations cause direct variations in capacity when the ferroelectric capacitors are formed, an operating margin can be made greater owing to the prevention of the pattern dimensional variations referred to above.

Figure 20:
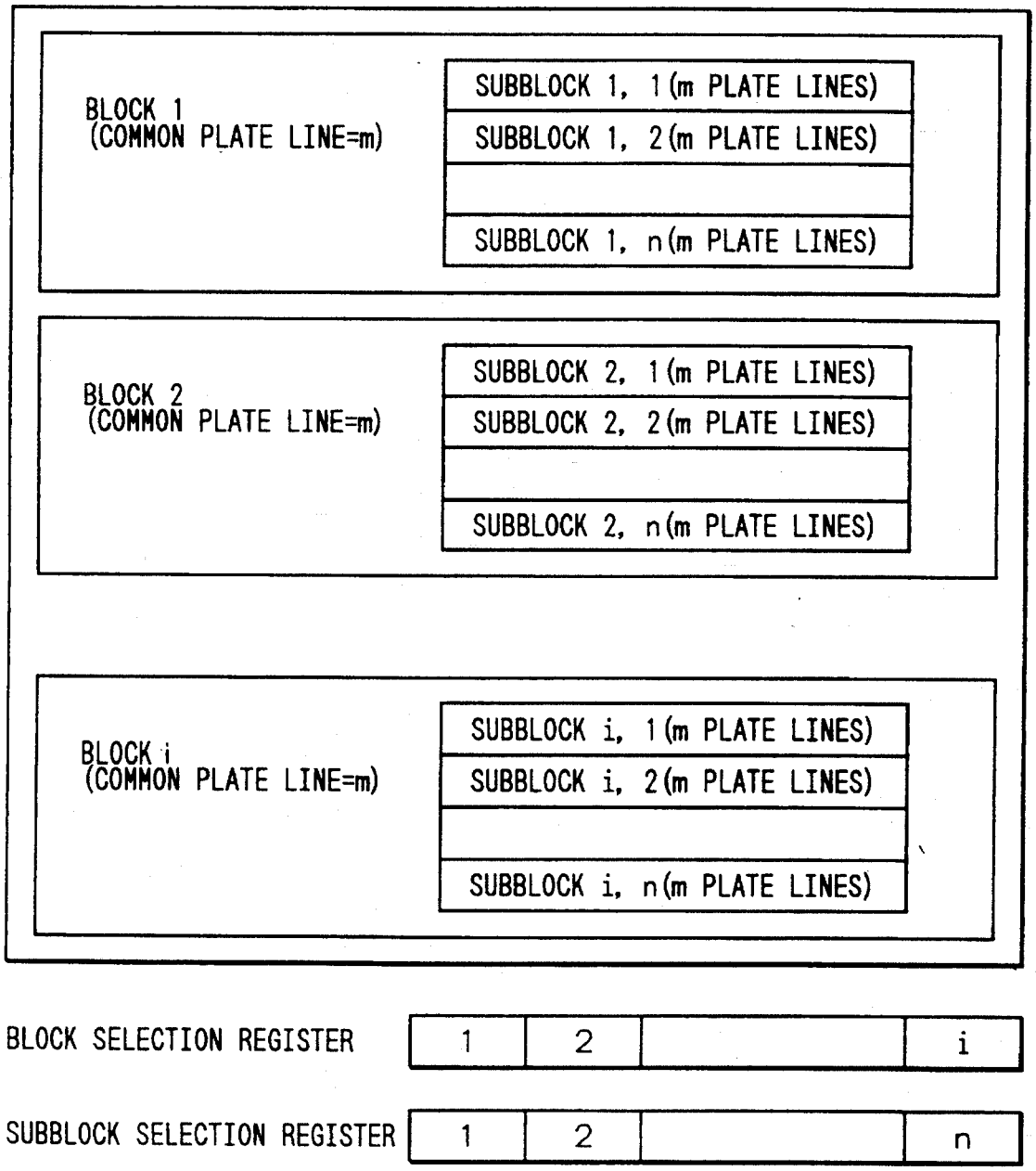
FIG. 20 is a view illustrating the structure of a semiconductor memory device according to the present invention.

FIG. 20 shows the structure of a semiconductor memory device (FRAM) according to the present invention. A relationship between blocks and subblocks and a relationship between common plate lines and plate lines are shown in the same drawing.

As the number of blocks, i blocks of 1 to i are provided. n subblocks are provided for each block. When m plate lines (electrodes) exist in each subblock, the required number of common plate lines reaches m. This means that the total number of respective plate lines (n×m) can be reduced to 1/n. As a result, the number of plate line drivers can also be reduced to m.

The selection of the blocks at the time of data writing and reading processes is performed by using a block register. The selection of the subblocks in each block is carried out by using a subblock selection register. When the subblocks are different in number every blocks as in the above example, the number of subblock selection registers is set to the maximum number of subblocks held by one block. Although there is no particular restriction, the number of subblocks in each block is stored in the block selection register so that an undesired selection is not performed. If the maximum number of subblocks held by the single block is $2^k$, bits for the block selection register are respectively set as K+1 bits.

Figure 21:
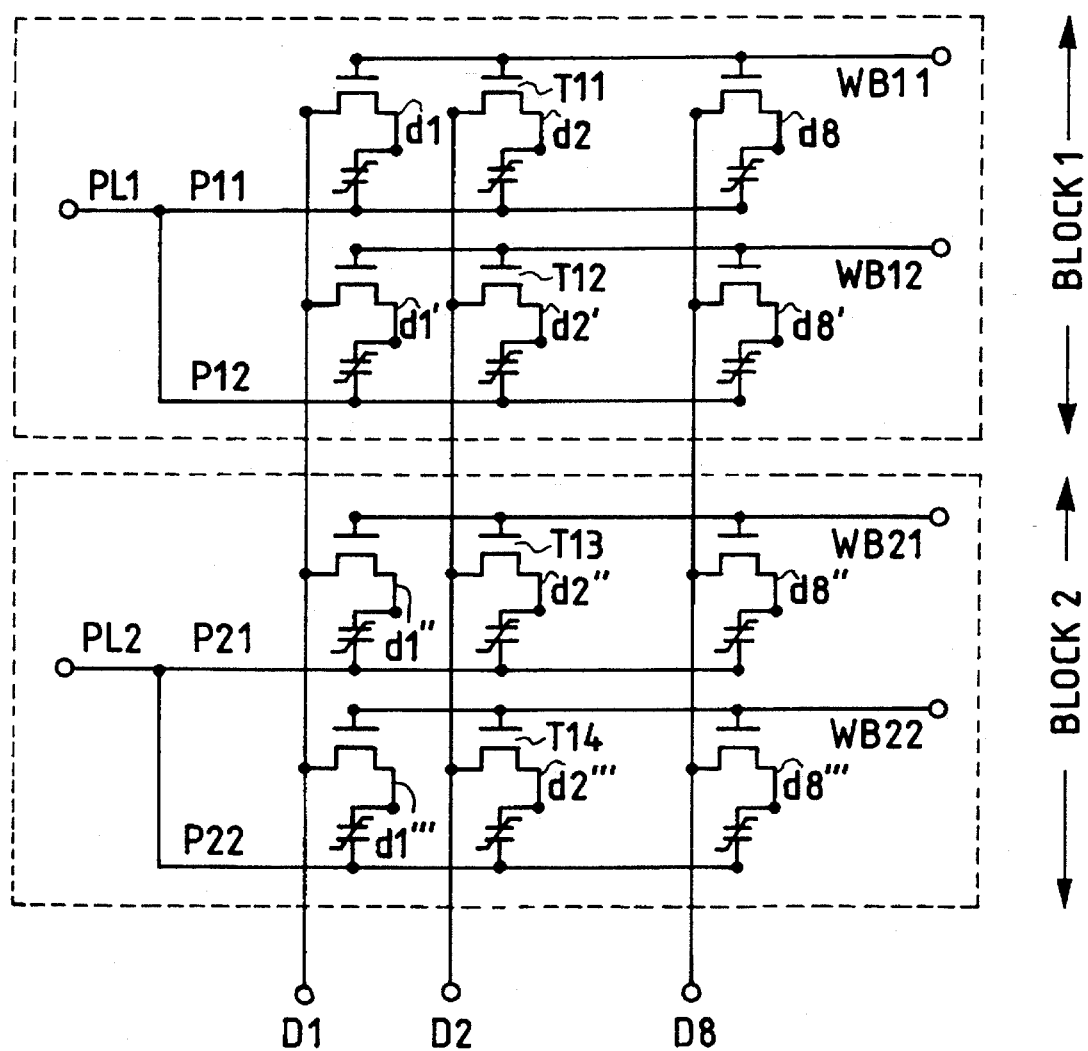
FIG. 21 is a circuit diagram showing a still further example of the memory array of the semiconductor memory device according to the present invention.

FIG. 21 is a circuit diagram showing a still further example of the memory array employed in the semiconductor memory device according to the present invention. In the present example, each memory cell comprises a single switch MOSFET and a single ferroelectric capacitor in a manner similar to a dynamic RAM. Even in this case, plate lines P11 and P12 are used in common for each block and are electrically connected to a common plate line PL1. Thus, plate line drivers can be provided in block units. Further, the memory array can be formed in high density and an address selection circuit can be formed so as to match with the memory array.

Figure 22:
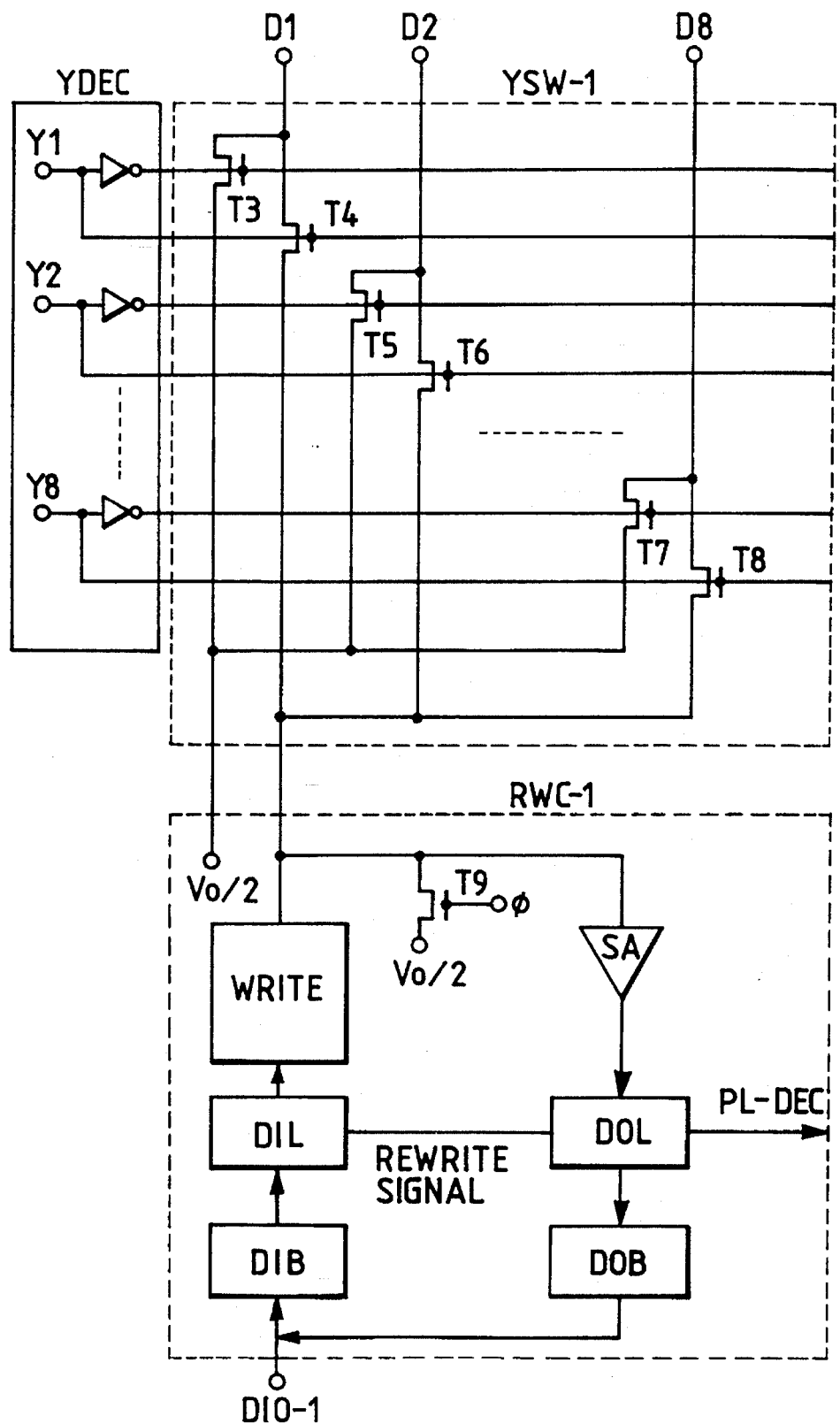
FIG. 22 is a circuit diagram illustrating one example of a Y-system selection circuit and a writing and reading circuit both employed in a semiconductor memory device according to the present invention.

FIG. 22 is a circuit diagram illustrating one example of a Y-system selection circuit and a writing and reading circuit. In the same drawing, a Y selector YSW-1 corresponding to a data terminal DIO-1 and a reading/writing circuit RWC-1 corresponding to the Y selector YSW-1 are shown as representatives by way of illustrative example.

In the Y selector YSW-1, a pair of switching elements comprised of a selection switch MOSFET T4 and a non-selection switch MOSFET T3 is provided for a single main data line D1 shown as a representative by way of illustrative example. Similarly, non-selection and selection switches MOSFETs T5 and T6 and T7 and T8 are respectively provided for other data lines D2 and D8 shown as representatives by way of illustrative example. The selection switches MOSFETs T4, T6 and T8 are provided so as to connect their corresponding main data lines D1, D2 and D8 to a common data line.

The reading/writing circuit RWC-1 is connected to the common data line. Each of the non-selection switches MOSFETs T3, T5 and T7 supplies a voltage of Vo/2 corresponding to half the write (read) voltage Vo to each of their corresponding data lines D1, D2 and D8. Selection and non-selection switches MOSFETs similar to the above switches are respectively provided for unillustrated other main data lines D3 through D7.

A selection signal Y1 produced from a Y decoder YDEC is supplied to the gate of the selection switch MOSFET T4 corresponding to the data line D1. The gate of the non-selection switch MOSFET T3 is supplied with a signal obtained by inverting the selection signal Y1 by an inverter circuit. Similarly, other selection switches MOSFETs T6 and T8 are switch-controlled based on selection signals Y2 and Y8. The non-selection switches MOSFETs T5 and T7 are supplied with signals obtained by inverting the selection signals Y2 and Y8 with inverter circuits. Thus, when one data line is selected and connected to the common data line, each of other data lines is supplied with a bias voltage of Vo/2.

A write-system circuit comprises a data input buffer DIB, a data in-latch DIL and a write amplifier WRITE. A read-system circuit comprises a sense amplifier SA, a data out-latch DOL and a data output buffer DOB. Data supplied to the data in-latch DIL from the data out-latch DOL is used for rewriting based on the destructive readout. Namely, when the rewriting is required, the data output latch DOL supplies a rewrite signal to the data input buffer DIL and a decoder PL-DEC. Thus, a data line voltage and a plate line voltage are respectively reversed (Vo and 0 V are respectively changed to 0 V and Vo) so that the rewriting is performed.

A MOSFET T9 serves as a switch MOSFET for supplying a potential of Vo/2 to a common data line connected with the input of the sense amplifier SA and the output of the write amplifier WRITE in response to a timing signal φ. The switch MOSFET T9 precharges a selected main data line to Vo/2 upon precharge operation. At this time, non-selected main data lines are precharged to Vo/2 by the Y selector YSW-1. The precharge operation is completed and the switch MOSFET T9 is brought into an OFF state. As a result, the write amplifier WRITE or the sense amplifier SA is operated to perform a writing or reading operation.

The MOSFET T9 can be omitted. If output signals are produced from the decoder YDEC so that the Y selectors YSW-1 are all brought into a non-selected state upon the precharge operation, the voltage of Vo/2 can be outputted to all the main data line as described above. Since it is unnecessary to precharge internal data lines in each non-selection subblock memory circuit when each subblock memory circuit is provided with a stress-preventive voltage supply line and switches MOSFETS corresponding to the stress-preventive voltage supply line as in the case of the embodiments shown in FIG. 1 and the like, the above MOSFET T9 is deleted.

Figure 23:
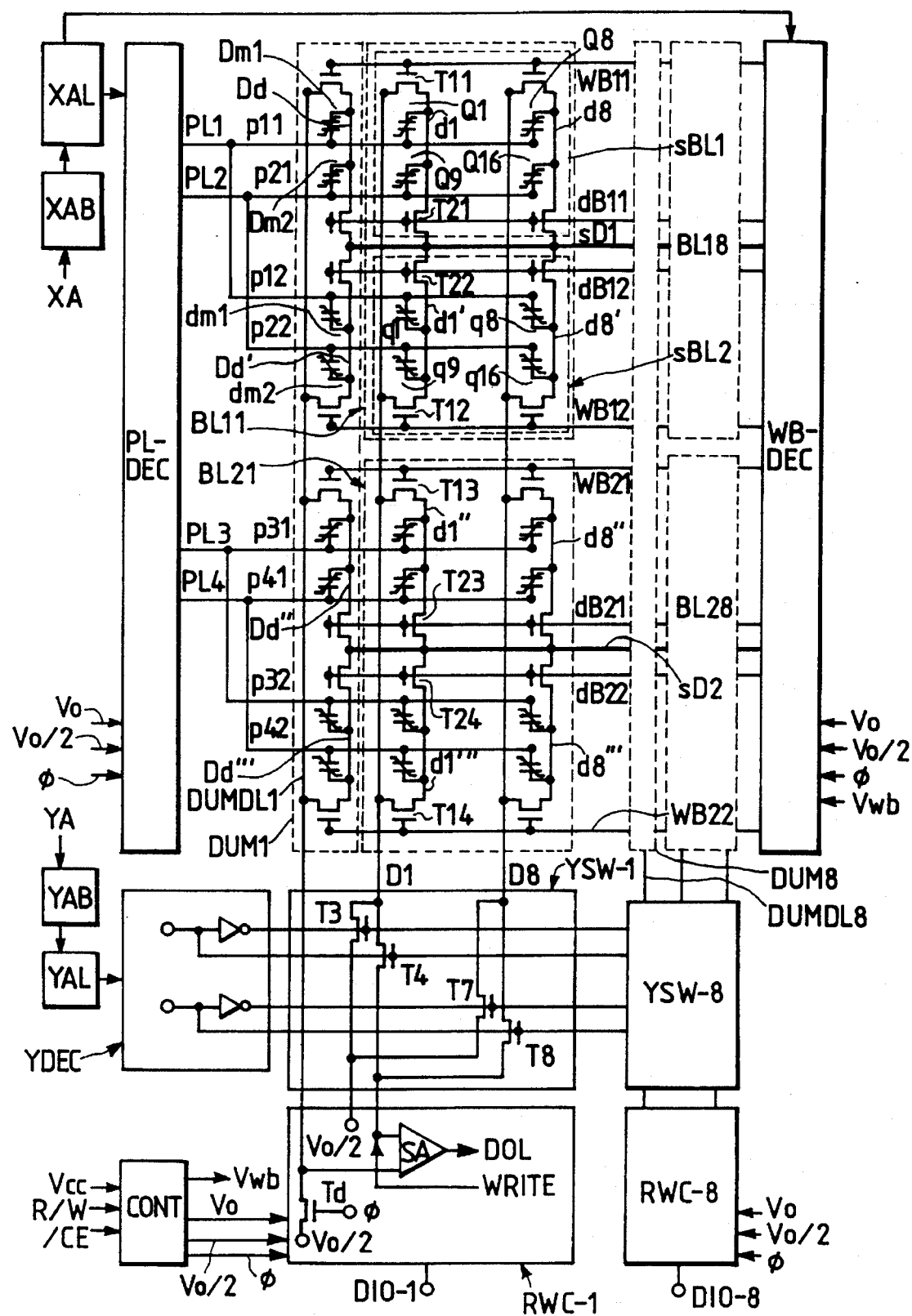
FIG. 23 is an overall circuit diagram showing a further embodiment of a semiconductor memory device according to the present invention.

FIG. 23 is an overall circuit diagram showing a further embodiment of a semiconductor memory device according to the present invention. A modification of the embodiment shown in FIGS. 2 and 3 is illustrated in the same drawing. In the present embodiment, a dummy data line DUMDL1 is provided to create a read reference voltage for a sense amplifier SA. A dummy switch MOSFET, dummy ferroelectric capacitors Dm1 and Dm2, etc. are provided so as to correspond to the dummy data line DUMDL1. A dummy array DUM1 comprises the dummy data line DUMDL1, the dummy switch MOSFET, the dummy ferroelectric capacitors Dm1 and Dm2, etc.

When data writing and reading processes are executed, dummy cells (ferroelectric capacitor Dm1 and the like) are supplied with a voltage of Vo/2 through a precharge MOSFET Td. Thus, stored information is not inverted upon execution of the writing and reading processes in the case of the dummy cells referred to above. Although particular restrictions are not imposed on the dummy cells, the dummy cells are respectively identical in structure to the memory cells. The capacitance of each dummy cell is larger than that of each memory cell. Each of main data lines is set so as to become identical in parasitic capacitance to the dummy data line. The sense amplifier SA can sense a read signal at high speed and with accuracy by, for example, setting a variation in potential of the dummy data line by each dummy cell to an intermediate portion between a variation in potential of each of the main data lines, which occurs due to the inversion or reversal of polarization of a selected memory cell and a variation in potential of each main data line, which takes place due to the non-reversal of polarization of the selected memory cell.

Since the present embodiment is identical in other structure to the embodiment shown in FIGS. 2 and 3, its description will be omitted. Even when the stress-preventive voltage supply line SD1 and the like and the switches MOSFETs provided so as to correspond to them have been omitted as in the embodiment shown in FIGS. 9 and 10, the dummy data line DUMDL can be provided so as to create the reference voltage for the sense amplifier SA. In this case, the precharging switch MOSFET T9 shown in FIG. 22 may be provided so as to be connected to the common data line.

Figure 24:
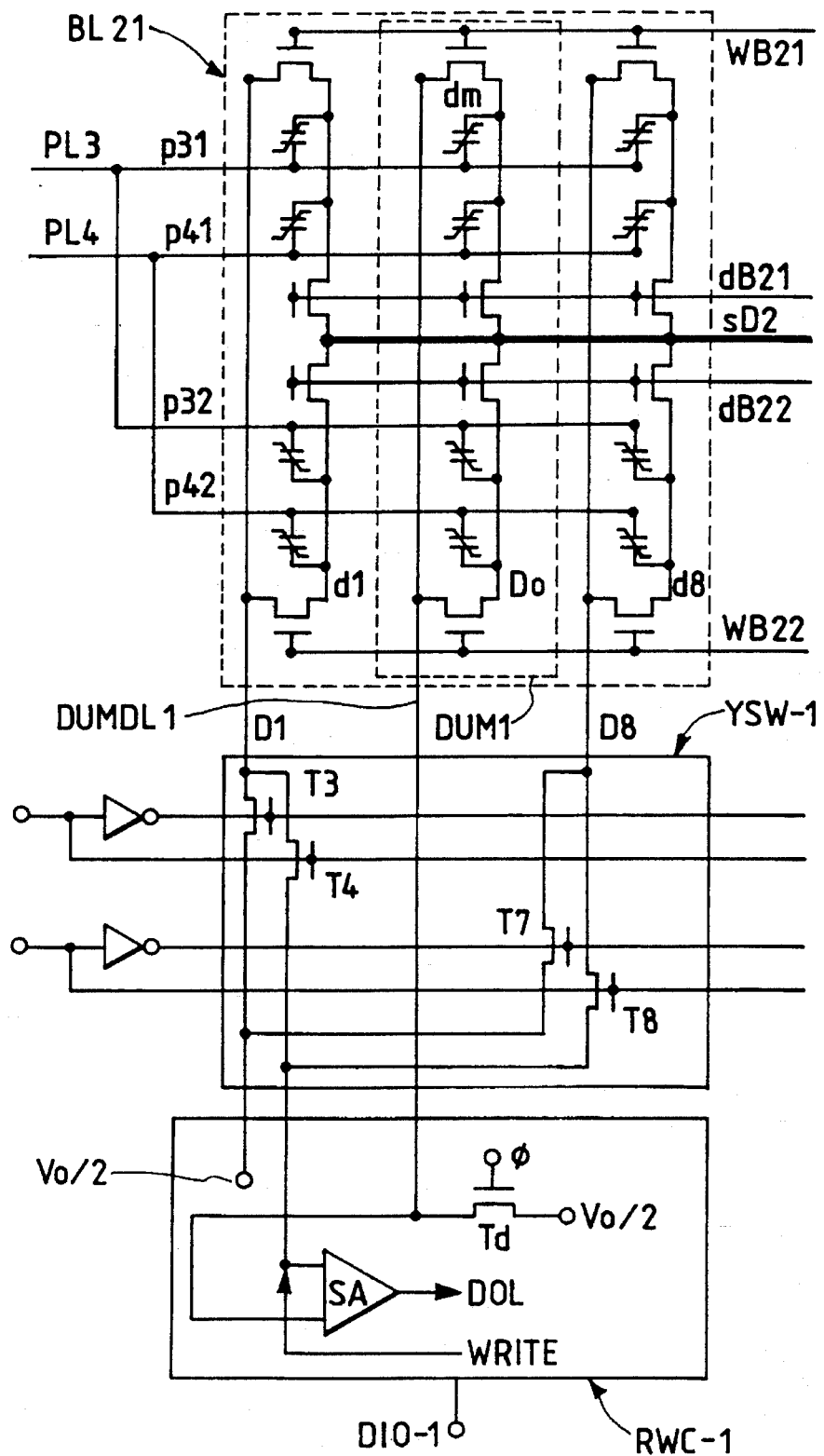
FIG. 24 is a circuit diagram illustrating another example of a memory array and an input/output system circuit both employed in the semiconductor memory device.

FIG. 24 is a circuit diagram showing another example of the memory array and the input/output system circuit both employed in the semiconductor memory device according to the present invention. The present embodiment shows a modification of the embodiment shown in FIG. 23 in which the dummy data line DUMDL is provided so as to create the reference voltage for the sense amplifier SA. In the present embodiment, a dummy data line DUMDL1 is provided at the central portion of a memory bock. Namely, the dummy array DUM1 is provided at the end of the memory block in the embodiment shown in FIG. 23, whereas a dummy array DUM1 corresponding to the dummy array DUM1 employed in the embodiment shown in FIG. 23 is provided at the central portion of a memory block BL21 in the present embodiment. When the dummy array DUM1 is provided at the central portion of the memory block as in the present embodiment, proper characteristics can be obtained with respect to any main data line in the memory block and a level margin for the sense amplifier SA can be made greater.

Figure 25:
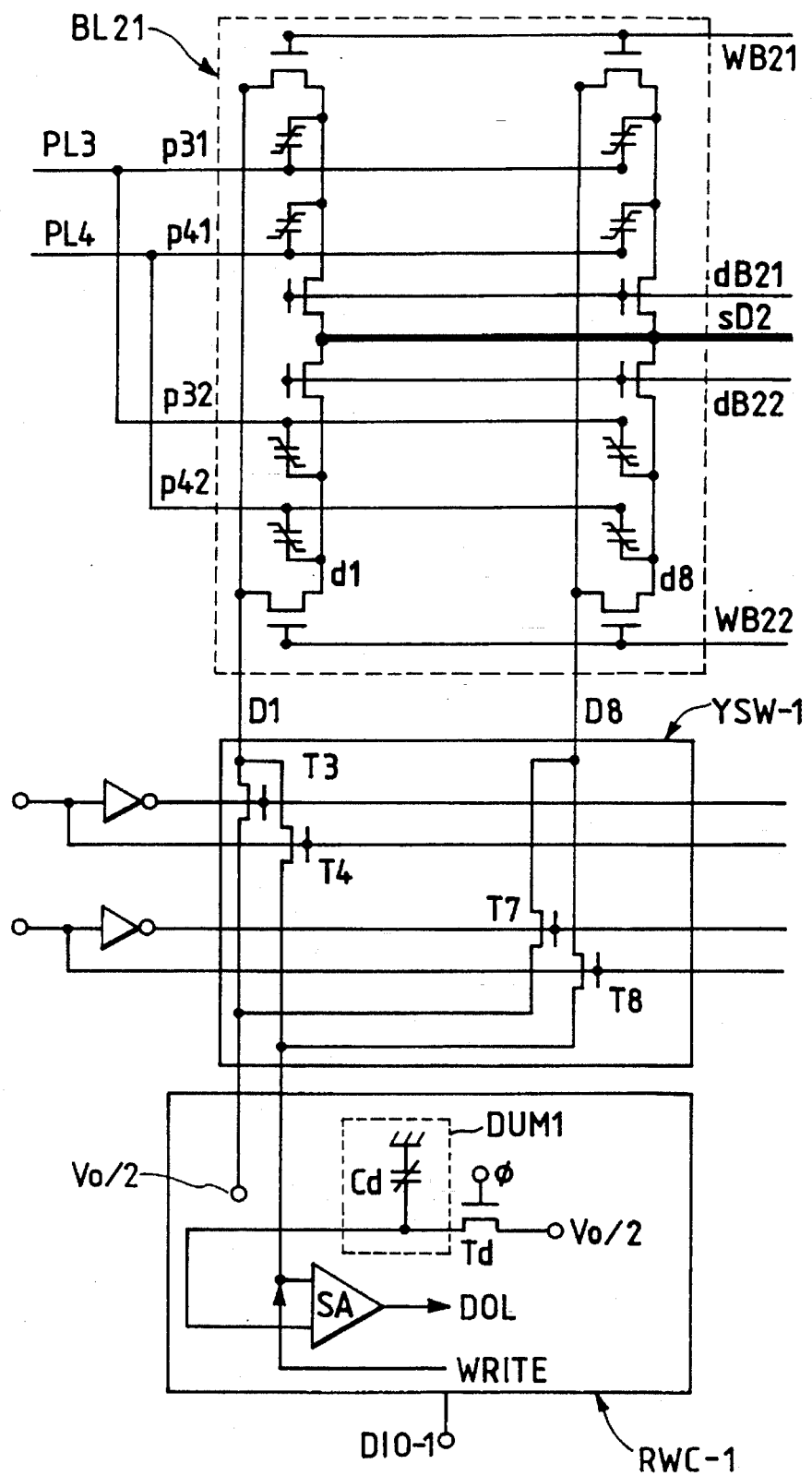
FIG. 25 is a circuit diagram showing a further example of the memory array and the input/output system circuit both employed in the semiconductor memory device.

FIG. 25 is a circuit diagram showing a further example of the memory array and the input/output system circuit both employed in the semiconductor memory device according to the present invention. In the present embodiment, a reference voltage for a sense amplifier SA is produced by using a dummy capacitor Cd as an alternative to the aforementioned dummy data line DUMDL. In this case, the capacitance value of the dummy capacitor Cd is set so as to become greater than the sum of the capacitance value of an actual main data line and that of each memory cell.

Even in the case of the present embodiment, a memory block from which the stress-preventive voltage supply line SD2 and the switches MOSFETs corresponding to the same are omitted, may be constructed. A plurality of dummy capacitors or the above dummy data line is provided within an area connected to a single sense amplifier. In this condition, a dummy capacitor or a dummy data line near the main data line selected by a Y selector may be selected. An operating margin for the sense amplifier SA can be made greater owing to such a structure.

Figure 26:
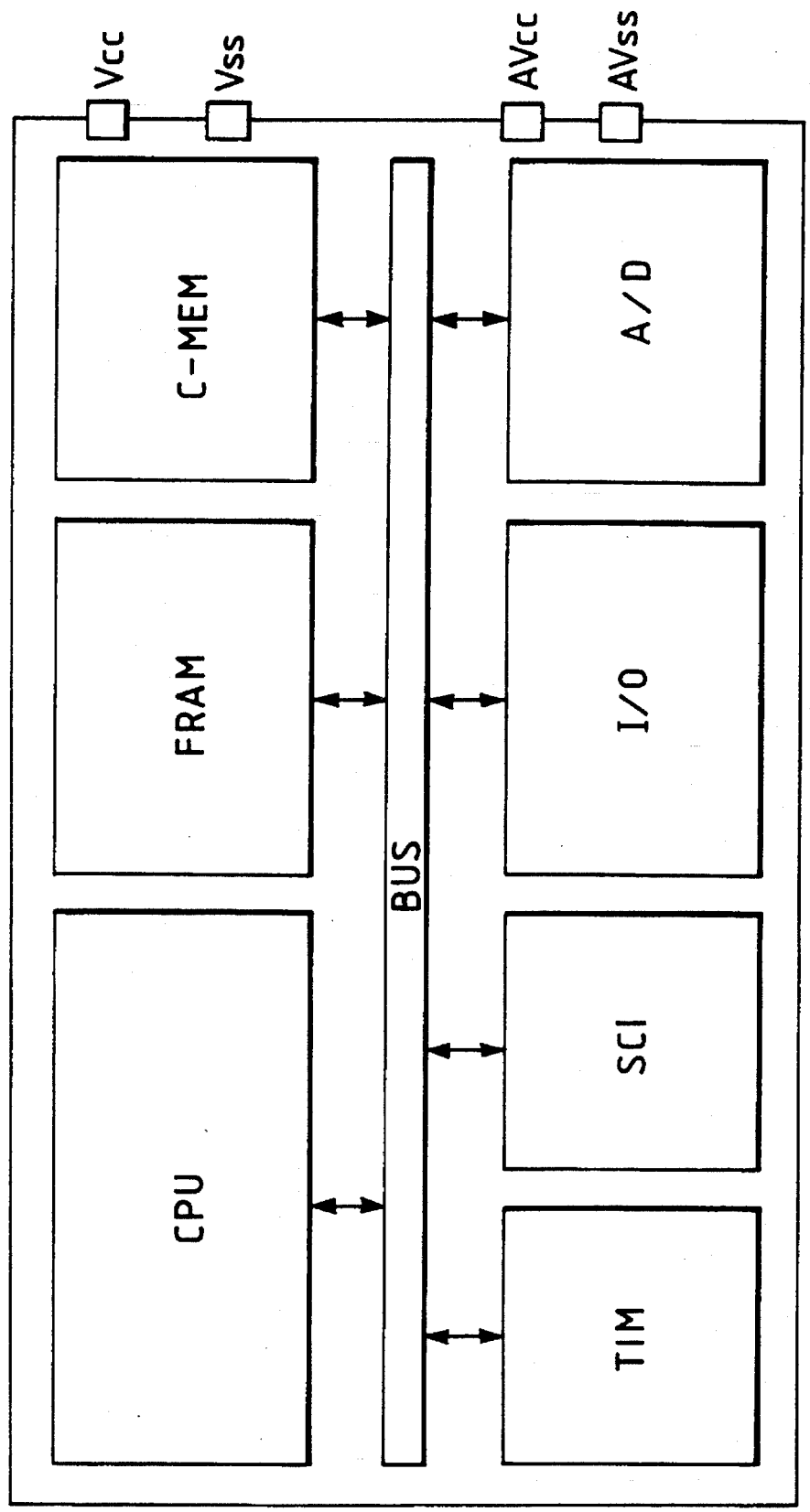
FIG. 26 is a block diagram illustrating one example of a microcomputer in which a semiconductor memory device according to the present invention is used.

FIG. 26 is a block diagram showing one example of a microcomputer in which a semiconductor memory device according to the present invention is employed. In the present example, a semiconductor memory device FRAM according to the present invention and a cash memory C-MEM are used as memory circuits. In the semiconductor memory device FRAM according to the present invention, a specific area in a memory array is used as a RAM (Random Access Memory) and other areas are used as a ROM (Read Only Memory). Although particular limitations are not placed on the semiconductor memory device FRAM, the semiconductor memory device FRAM has access to the memory block based on the voltage that does not cause the reversal of polarization as in the embodiment shown in FIG. 21 to perform the same operation as that of the dynamic RAM. When a power source or supply is connected to the microcomputer so that the microcomputer is brought into an operating state, a data process accompanied by a data writing and reading process can be effected on such a RAM area at high speed.

When the power supply connected to the microcomputer is cut off, those of the data stored in the RAM, that need nonvolatilization, are transferred to the ROM before its cut off. Thus, even if the power supply is cut off, the necessary data can be stored in the ROM. When the microcomputer starts to operate again owing to the turning on of the power supply, the data saved in the ROM is read so as to be transferred to the RAM and the high-speed data process is performed again using the RAM.

The number of times in which the FRAM is rewritten or reloaded can greatly be reduced by adopting such a structure. Thus, a restriction imposed on the number of times in which a rewriting process is effected on the FRAM, can substantially be eliminated. The above-described structure is suitable for an IC card. Namely, the IC card can nonvolatilize necessary stored data without providing a battery. The nonvolatile memory can be used without being substantially subjected to the restriction imposed on the number of times in which the nonvolatile memory is rewritten.

A CPU serves as a microprocessor (central processing unit) and processes data in accordance with a series of data processing programs. A timer circuit TIM, a serial communication interface SCI, an analog/digital converter circuit A/D and an input/output circuit I/O are provided as peripheral circuits through a BUS with the microprocessor CPU as the center as well as the above semiconductor memory device FRAM and the C-MEM.

Although particular restrictions are not placed on power terminals Vcc and Vss, about 5 V and 0 V are supplied to the power terminals Vcc and Vss. These voltages are used as power supply voltages for the digital circuits. Write voltages Vo and Vo/2 necessary for the operation of the semiconductor memory device FRAM and a selection voltage Vw applied to a first word line, and the like, are produced by an internal boosting circuit.

Power terminals AVcc and AVss are supplied with power supply voltages for analog circuits. By separately providing the power supplies with respect to the digital circuits and the analog circuits, relatively large noises produced in a power line on the digital circuits side can be prevented from leaking to a power line on the analog circuits side.

It is needless to say that the microcomputer may be constructed of boards each comprised of a single semiconductor integrated circuit device and mounted on a mounting substrate such as a printed board or the like. Since a memory circuit FARAM can be comprised of a plurality of semiconductor memory devices, a large storage capacity can be set to the memory circuit. Further, a RAM or the like may be connected to the microcomputer as an external memory.

Figure 29:
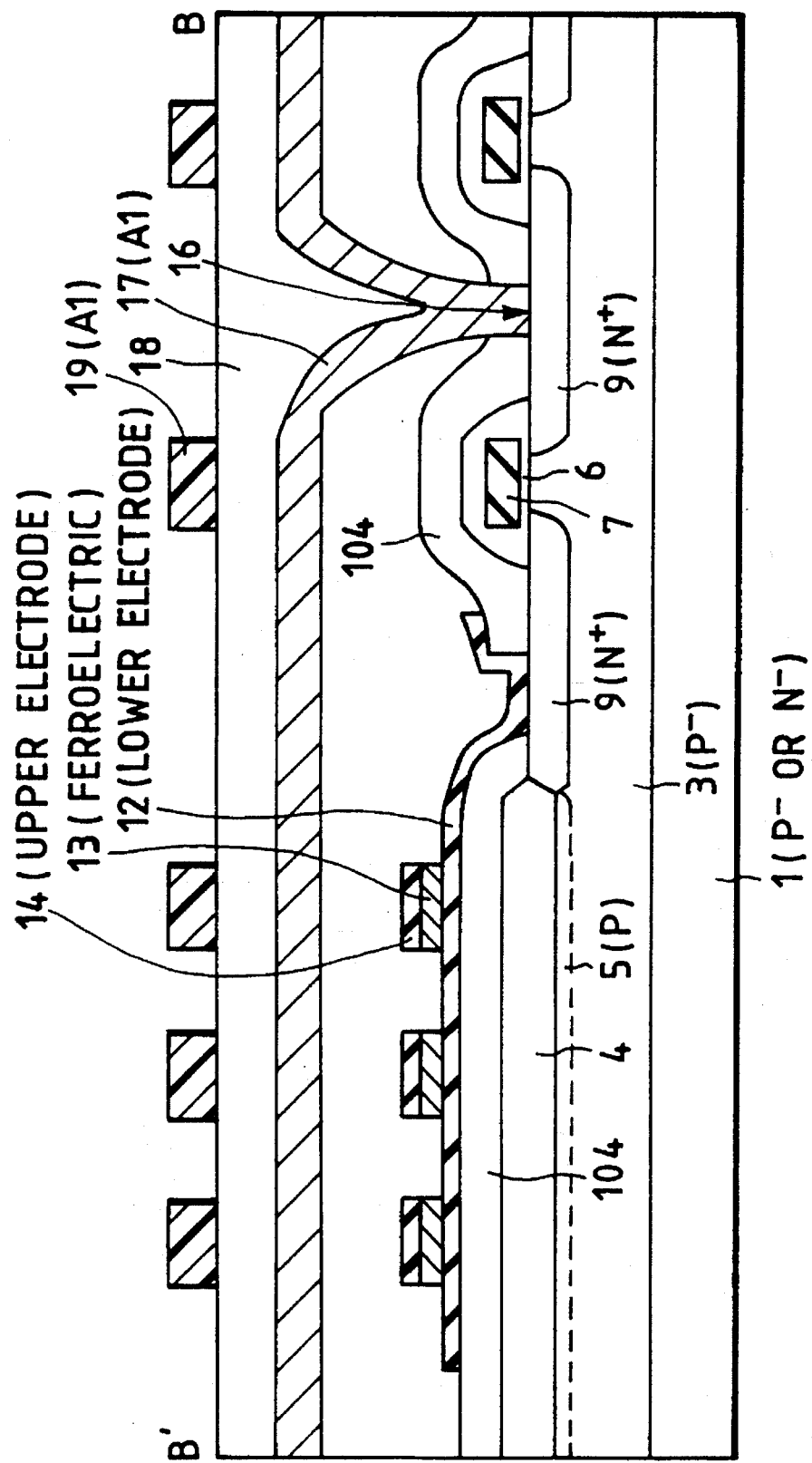
FIG. 29 is a cross-sectional view taken along line B - B' of FIG. 27.

FIG. 27 is a view for describing a layout showing a still further example of the memory array of the semiconductor memory device according to the present invention. FIG. 28 is a cross-sectional view taken along line A - A' of FIG. 27. FIG. 29 is a cross-sectional view taken along line B - B' of FIG. 27.

In the present embodiment as is apparent from FIGS. 27 through 29, lower electrodes 12 of ferroelectric capacitors are formed on their corresponding field insulating films 4 and electrically connected to the sources or drains of transfer MOSFETS. Thus, each of diffusion layers 9, which form the source or drain of each transfer MOSFET, is set to a small size required to obtain contacts 116. As a result, parasitic resistance values of subdata lines in a subblock slightly increase, whereas their parasitic capacities can be greatly reduced.

Figure 31:
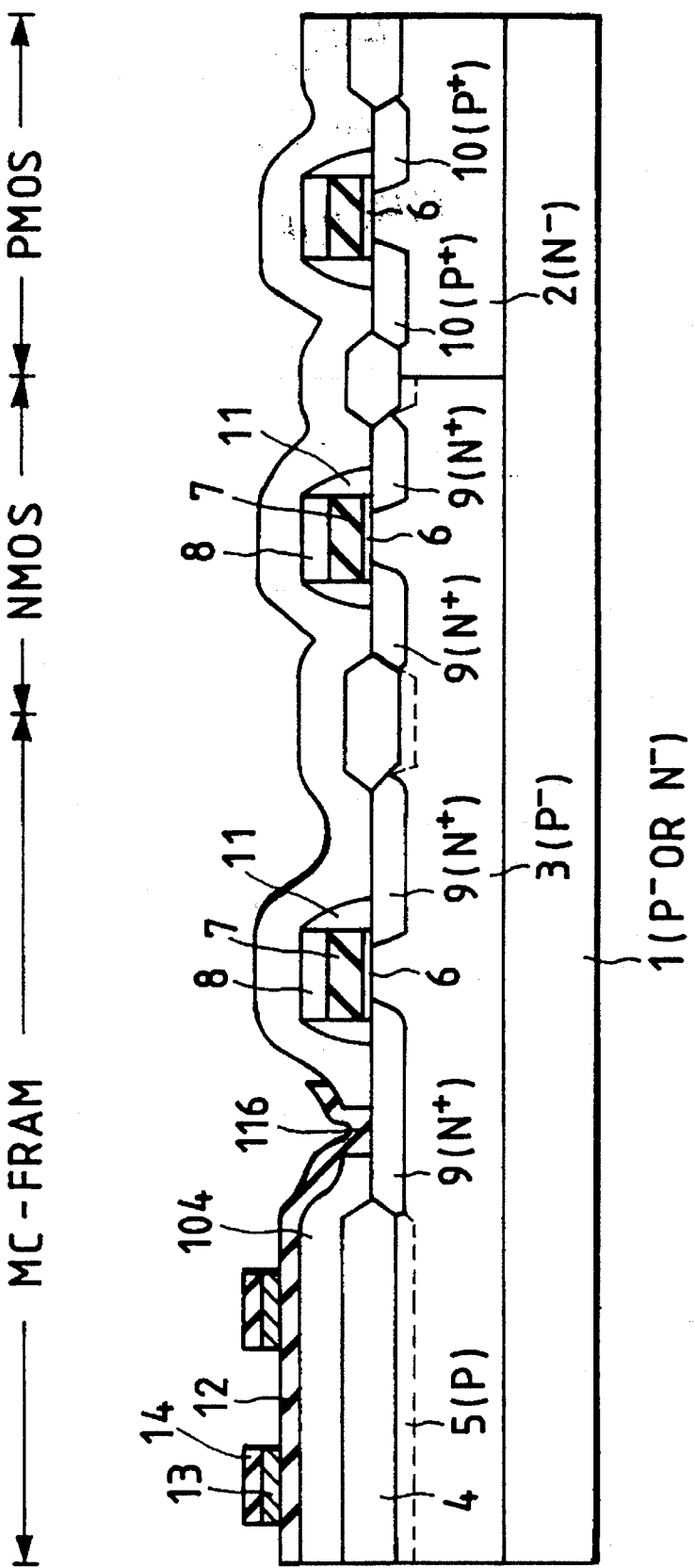
FIG. 31 is a cross-sectional view illustrating residual partial manufacturing processes for describing the one example of the method of manufacturing the semiconductor memory device shown in FIG. 27.
Figure 32:
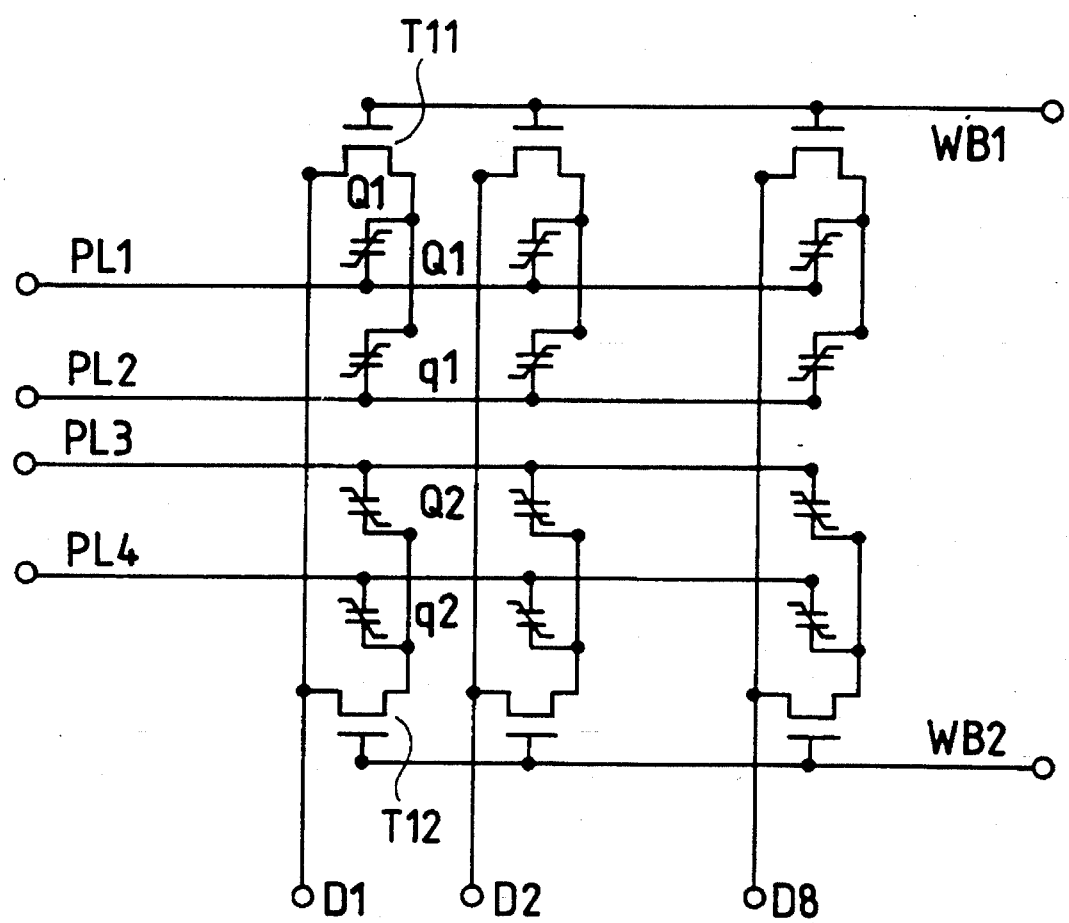
FIG. 32 is a circuit diagram showing one example of a prior art.

FIGS. 30(A) and 30(B) and FIG. 31 are respectively cross-sectional views showing manufacturing processes for describing one example of a method of manufacturing the above semiconductor memory device. Details of the structure of the semiconductor memory device constructed in the above-described manner will be understood easier from the description of the following manufacturing method. Unit memory circuits MC-FRAMs and N-channel MOSFETs and P-channel MOSFETs employed in peripheral circuits of the MC-FRAMs are also collectively shown in the same drawings.

A $P^-$ layer 3 is provided at a portion on a $P^-$ or $N^-$ type semiconductor substrate 1, in which the unit memory circuit MC-FRAM and the N-channel MOSFET are formed. An $N^-$ layer 2 is provided at a portion on the semiconductor substrate 1, in which the P-channel MOSFET is formed.

The field insulating films 4 are formed with diffusion layers for the formation of elements left as they are. A P-channel stopper 5 is formed below each field insulating film 4. Thin gate insulating films 6 are formed on the surfaces of element-forming regions surrounded by the field insulating films 4. Further, gate electrodes 7 each comprised of polysilicon or polyside are formed on their corresponding gate insulating films 6. $N^+$ type diffusion layers 9, which form the source and drain of the N-channel MOSFET, are formed with the gate electrode 7 and the field insulating film 4 as masks. $P^+$ type diffusion layers 10, which form the source and drain of the P-channel MOSFET, are formed in another step. $CVD-SiO_2$ is formed on each of the gate insulating films 6.

Side walls 11 each comprised of $CVD-SiO_2$ are formed on the gate electrodes 7. Further, interlayer insulating films 104 each comprised of $CVD-SiO_2$ are formed. An opening 116 is provided at a portion corresponding to the source or drain of the transfer MOSFET.

As shown in FIG. 30(B), a siliside film 12 comprised of Pt or the like is formed on its corresponding field insulating film 4 by a known method with the interlayer insulating film 104 interposed therebetween. For example, the Pt or the like is deposited on the interlayer insulating layer 104 so as to be brought into silicoide, after which a lower electrode 12 is formed by patterning.

Each of ferroelectrics 13 comprised of PZT or the like is deposited by the known method as shown in FIG. 31. Each of upper electrodes 14 made of Pt or the like is formed on the ferroelectric 13. The upper electrodes 14 and the ferroelectrics 13 are simultaneously patterned. Thus, N-channel MOSFETs used as transfer MOSFETs necessary for a unit memory circuit and ferroelectric capacitors are formed. Thereafter, an interlayer insulating film is formed on the resultant product. Each of data lines is made up of aluminium or the like and is connected to the drain (or source) of each transfer MOSFET. When required, the interlayer insulating film is formed as in the above embodiment and a metallic wired layer 19 for shunt, which is made of aluminium or the like, is formed to reduce the resistance value of each word line.

When ferroelectric capacitors arranged in the horizontal direction are used as an alternative to the ferroelectric capacitors provided in plural form with respect to the single transfer MOSFET and vertically stacked on each other in the form of a conventional multilayered structure as described in the above embodiments, they can be processed in a one-time step of forming the ferroelectric capacitors. It is therefore possible to greatly reduce manufacturing steps. Namely, if the vertical stack structure is taken, manufacturing processes equal to the number of the ferroelectric capacitors are repeated. As a result, the manufacturing processes are complicatedly divergent.

When the manufacturing processes are complicated, variations and degradation in characteristics of the ferroelectric capacitors take place as well as a simple increase in cost. Namely, since capacitor's dielectrics provided on the lower side are subjected to heat treatment each time the process of manufacturing capacitors formed on the dielectrics is executed, it is considered that they are under the influence of its process and degraded in characteristics.

When the multilayered structure is taken, it is considered that the capacitors, which form the unit memory circuit, vary in size due to a displacement in mask and the like and a relatively large variation in the movement of charges, which occurs upon the reversal of polarization at the time of a reading operation, takes place due to the degradation and variations in the characteristics of the above dielectrics. Thus, the operating margin for the sense amplifier become worse and hence a reading failure and the like tend to occur.

On the other hand, when the horizontal arrangement structure is taken as in the present embodiment, a plurality of capacitors are similarly formed in the same step. Therefore, no variations in their characteristics occur and stable reading and writing characteristics can be obtained.

In the horizontal arrangement structure, the area occupied by a memory array itself inevitably increases. In this respect, the conventional vertical stack structure is superior to the horizontal arrangement structure. However, any high integration of the memory array itself does not make sense. It must be borne in mind that an address selection circuit for selecting a memory cell and applying or supplying a write voltage or a non-selection voltage exists. Namely, even if the vertical stack structure is taken to narrow the pitch of each second word line, it does not make sense in practice unless a circuit for selecting the second word line is also formed in the vertical stack structure. Since a CMOS circuit such as a decoder or the like cannot be vertically arranged in general, it is not too much to say that the above vertical stack structure is not suited for substantial high integration unless the decoder having the vertical stack structure is developed.

In the present embodiment, the pitch of the decoder circuit or the like can be increased by the number of common plate lines so as to correspond to the pitch of each plate line by providing the second word lines connected to the electrodes of the ferroelectric capacitors side by side in the horizontal direction and providing the plate lines corresponding to the other electrodes of the ferroelectric capacitors in common every subblocks. Further, the address selection circuit related to this structure can be brought into alignment with the memory array. As a result, the address selection circuit can be laid out on the semiconductor substrate with sufficient efficiency.

Operations and effects obtained from the above embodiments are as follows:

(1) Each of a plurality of subblock memory circuits is provided wherein one electrodes are respectively electrically common-connected to one ends of first switching elements whose control terminals are electrically connected to a first address selection line, the other electrodes arranged side by side along the horizontal direction so as to meet at right angles to the one electrodes are set as second address selection lines and ferroelectric capacitors are formed at points where the one electrodes and the other electrodes respectively intersect. Different addresses are assigned to the first address selection lines of the respective subblock memory circuits and common addresses are respectively assigned to the second address selection lines of the plurality of subblock memory circuits, thereby forming a common address selection circuit. When the first address selection line is in a selected state and the first switching elements are turned ON, one of the plurality of second address selection lines is brought into a selected state and is supplied with a voltage that develops polarization in each of the ferroelectric capacitors. Further, the remaining second address selection lines are brought into such a non-selected potential that a voltage applied to each of the ferroelectric capacitors reaches substantially half the voltage applied to the selected ferroelectric capacitor. When the first address selection line is brought into a non-selected state and the first switching elements are turned OFF, such a non-selected voltage that the voltage applied to each of the ferroelectric capacitors reaches substantially zero is supplied to each of the plurality of second address selection lines. Thus, the voltage can be prevented from being applied to each of the ferroelectric capacitors of the subblock memory circuit, corresponding to the non-selected switching elements while a memory array using the ferroelectric capacitors is being brought into high integration. Therefore, an advantageous effect can be obtained wherein stresses exerted on the ferroelectric capacitors can greatly be reduced.

(2) Second switching elements are provided on the shared one electrodes side of the ferroelectric capacitors. When the first switching elements of each subblock memory circuit, which correspond to the second switching elements, are in an ON state, the second switching elements are brought into an OFF state. Further, when the corresponding first switching elements of each subblock memory circuit are in an OFF state, the second switching elements are brought into an ON state. In this condition, the same potential as that applied to non-selected second address selection lines is supplied to the second switching elements. As a result, an advantageous effect can be obtained wherein stresses exerted on the ferroelectric capacitors of each subblock memory circuit, which correspond to the non-selected switching elements, can efficiently be reduced.

(3) Non-selected subblock memory circuits of the plurality of subblock memory circuits are supplied with a precharge voltage substantially equal to half the voltage that develops polarization in the ferroelectric capacitors through the first switching elements. First switching elements of subblock memory circuits selected after such a precharge operation has been completed, are brought into an ON state. Further, one of the plurality of second address selection lines is brought into a selected state and is supplied with a voltage that develops polarization in the selected ferroelectric capacitor. Thereafter, the remaining second address selection lines are supplied with such a non-selected voltage that a voltage applied to each of the ferroelectric capacitors reaches substantially half the voltage applied to the selected ferroelectric capacitor. Thus, an advantageous effect can be obtained wherein stresses placed on the ferroelectric capacitors of the subblock memory circuit, which correspond to the non-selected switching elements, can greatly be reduced while the second address selection lines of each subblock are made common in a simple structure.

(4) Memory cell arrays each having memory cells each comprised of a single switching element and a single ferroelectric capacitor are provided side by side. The above one electrodes are omitted from such memory cell arrays and the other electrodes of dummies corresponding to the second address selection lines are provided so that layout patterns of the second address selection lines are constructed in a manner similar to those of each subblock memory circuit. Thus, an advantageous effect can be obtained wherein while memory blocks different in structure from each other are being formed, the dimensions of the patterns can be prevented from varying due to non-dense and dense states of the other electrodes of the capacitors, and an operating margin can be ensured.

(5) An advantageous effect can be obtained wherein the number of times in which a voltage that fatigues the non-selected ferroelectric capacitors is applied, can greatly be reduced by performing a memory access in memory block units as compared with the case where the individual dielectric capacitors are accessed on a random basis.

(6) An initial process is effected on each ferroelectric capacitor of the memory block so that the polarization is developed on the one side. Further, only data that reverses the polarization is actually written with the initialization as reference. As a result, an advantageous effect can be obtained wherein a substantial write time can be shortened and power consumption can be reduced.

The invention made by the present inventors as described above, has specifically been described based on the embodiments. However, the present invention is not necessarily limited to the aforementioned embodiments. It is needless to say that various changes and modifications can be made without departing from the spirit or scope of the invention as set forth herein. For example, ferroelectric materials forming ferroelectric capacitors are already known by the above publication and may be of any materials.

The net size or magnitude of remanence of ferroelectric crystalline, for example, is determined by the sum of projection with respect to vectors of electric fields applied onto crystal axes. Thus, when the crystal axes vary in all directions, the net remanence is reduced. To increase the remanence, a portion in which an angle formed by the direction of each crystal axis and the applied voltage is less than or equal to 5, is formed so that the ferroelectric crystalline forming each ferroelectric capacitor increases in percentage as much as possible, i.e., reaches 80% or more, for example. As the ferroelectric crystalline, may be mentioned BaTiO, PZT or the like.

Peripheral circuits for a memory array can take various forms described in the embodiments, such as one comprised of an N-channel MOSFET or a P-channel MOSFET, one formed by combining a MOSFET and a bipolar transistor, etc. as well as one comprised of the CMOS circuit.

As a method of inputting addresses, a method of inputting addresses assigned to memory cells as in the case of a normal RAM or ROM may be used as well as the method of inputting the address signal in the block unit as described above. In this case, to reduce the number of the external terminals, an X system and a Y system may be multiplexed from a common address terminal so as to input addresses as in the case of the dynamic RAM.

Advantageous effects obtained by typical ones of the invention disclosed in the present application will be described in brief as follows. Namely, each of a plurality of subblock memory circuits is provided wherein one electrodes are respectively electrically common-connected to one ends of first switching elements whose control terminals are electrically connected to a first address selection line, the other electrodes arranged side by side along the horizontal direction so as to meet at right angles to the one electrodes are set as second address selection lines and ferroelectric capacitors are formed at points where the one electrodes and the other electrodes respectively intersect. Different addresses are assigned to the first address selection lines of the respective subblock memory circuits and common addresses are respectively assigned to the second address selection lines of the plurality of subblock memory circuits, thereby forming a common address selection circuit. When the first address selection line is in a selected state and the first switching elements are turned ON, one of the plurality of second address selection lines is brought into a selected state and is supplied with a voltage that develops polarization in each of the ferroelectric capacitors. Further, the remaining second address selection lines are brought into such a non-selected potential that a voltage applied to each of the ferroelectric capacitors reaches substantially half the voltage applied to the selected ferroelectric capacitor. When the first address selection line is brought into a non-selected state and the first switching elements are turned OFF, each of the plurality of second address selection lines is supplied with such a non-selected voltage that the voltage applied to each of the ferroelectric capacitors reaches substantially zero. As a result, the voltage can be prevented from being applied to each of the ferroelectric capacitors of the subblock memory circuit, corresponding to the non-selected switching elements while a memory array using the ferroelectric capacitors is being brought into high integration. Therefore, stresses exerted on the ferroelectric capacitors can greatly be reduced.

Second switching elements are provided on the shared one electrodes side of the ferroelectric capacitors. When the first switching elements of each subblock memory circuit, which correspond to the second switching elements, are in an ON state, the second switching elements are brought into an OFF state. Further, when the corresponding first switching elements of each subblock memory circuit are in an OFF state, the second switching elements are brought into an ON state. In this condition, the same potential as that applied to non-selected second selection lines is supplied to the second switching elements. As a result, stresses placed on the ferroelectric capacitors of each subblock memory circuit, which correspond to the non-selected switching elements, can efficiently be reduced.

Non-selected subblock memory circuits of the plurality of subblock memory circuits are supplied with a precharge voltage substantially equal to half the voltage that develops polarization in the ferroelectric capacitors through the first switching elements. First switching elements of subblock memory circuits selected after such a precharge operation has been completed, are turned ON. Further, one of the plurality of second address selection lines is brought into a selected state and is supplied with a voltage that develops polarization in the selected ferroelectric capacitor. Thereafter, the remaining second address selection lines are supplied with such a non-selected voltage that a voltage applied to each of the ferroelectric capacitors reaches substantially half the voltage applied to the selected ferroelectric capacitor. Thus, stresses exerted on the ferroelectric capacitors of the subblock memory circuit, which correspond to the non-selected switching elements, can greatly be reduced while the second address selection lines of each subblock are made common in a simple structure.

Memory cell arrays each having memory cells each comprised of a single switching element and a single ferroelectric capacitor are provided side by side. The above one electrodes are omitted from such memory cell arrays and the other electrodes of dummies corresponding to the second address selection lines are provided so that layout patterns of the second address selection lines are constructed in a manner similar to those of each subblock memory circuit. Thus, while memory blocks different in structure from each other are being formed, the dimensions of the patterns can be prevented from varying due to non-dense and dense states of the other electrodes of the capacitors, and an operating margin can be ensured.

The number of times in which a voltage that fatigues the non-selected ferroelectric capacitors is applied, can greatly be reduced by performing a memory access in memory block units as compared with the case where the individual dielectric capacitors are accessed on a random basis.

An initial process is effected on each ferroelectric capacitor of the memory block so that the polarization is developed on the one side. Further, only data that reverses the polarization is actually written with the above initialization as reference. As a result, a substantial write time can be shortened and power consumption can be reduced.

What is claimed is:

1. A semiconductor memory device having a plurality of subblock memory circuits wherein one electrodes are respectively electrically common-connected to one ends of first switching elements whose control terminals are electrically connected to respective first address selection lines, the other electrodes arranged on a semiconductor substrate side by side in flat form so as to meet at right angles to the one electrodes are set as second address selection lines and ferroelectric capacitors are formed at points where the one electrodes and the other electrodes respectively intersect, said semiconductor memory device being characterized in that different addresses are assigned to the first address selection lines of said plurality of subblock memory circuits, common addresses are respectively assigned to the second address selection lines of said plurality of subblock memory circuits, thereby forming a address selection circuit being in common to the second address selection lines to which the corresponding addresses are assigned, when one of the first address selection lines is in a selected state and the first switching elements are brought into an ON state, one of the plurality of second address selection lines is brought into a selected state and is supplied with a voltage that develops polarization in each of the ferroelectric capacitors and the remaining second address selection lines are brought into such a non-selected potential that a voltage applied to each of the ferroelectric capacitors reaches substantially half the voltage applied to the selected ferroelectric capacitor, and when the first address selection line is brought into a non-selected state and the first switching elements are brought into an OFF state, such a non-selected potential that the voltage applied to each of the ferroelectric capacitors reaches substantially zero is supplied to each of the plurality of second address selection lines.

2. The semiconductor memory device according to claim 1, wherein the second switching elements are provided on the shared one electrodes side of the ferroelectric capacitors and when the first switching elements of the subblock memory circuit corresponding to the second switching elements are in an ON state, the second switching elements are turned OFF, whereas when the first switching elements of the subblock memory circuit are in an OFF state, the second switching elements are turned ON, thereby supplying a potential identical to that applied to the non-selected second address selection lines to the second switching elements.

3. The semiconductor memory device according to claim 1, wherein non-selected subblock memory circuits of said plurality of subblock memory circuits are supplied with a precharge voltage substantially equal to half the voltage that develops polarization in the ferroelectric capacitors through the first switching elements, the first switching elements of the subblock memory circuits selected after such a precharge operation has been completed, are turned ON, one of the plurality of second address selection lines is brought into a selected state and is supplied with a voltage that develops polarization in the selected ferroelectric capacitor, and the remaining second address selection lines are set to a non-selected voltage substantially equal to half the voltage applied to the selected ferroelectric capacitor.

4. The semiconductor memory device according to claim 3, wherein said plurality of subblock memory circuits are arranged in matrix form and X-system addresses are assigned to the first and second address selection lines, and said first switching elements connect the corresponding subblock memory circuit to one of a plurality of signal lines to which Y-system addresses are assigned.

5. The semiconductor memory device according to claim 4, wherein pairs of switching elements are respectively provided with respect to the plurality of signal lines, the selected one signal line is electrically connected to a common signal line through one switching element and is supplied with a selected voltage, and the remaining non-selected signal lines are supplied with a voltage substantially equal to half the selected voltage through the other switching element.

6. The semiconductor memory device according to claim 5, wherein control terminals of the pairs of switching elements are respectively complimentarily supplied with signals produced by a Y-system decoder circuit.

7. The semiconductor memory device according to claim 6, wherein said plurality of subblock memory circuits which respectively share the first and second address selection lines, form one memory block so that a memory access is performed in a memory block unit.

8. The semiconductor memory device according to claim 7, wherein said memory block is initialized so as to produce polarization on the one side of the ferroelectric capacitors provided in said memory block and only data that reverses the polarization is actually written with the initialization as reference.

9. The semiconductor memory device according to claim 1, wherein memory cell arrays each having memory cells each comprised of a single switching element and a single ferroelectric capacitor are provided side by side.

10. The semiconductor memory device according to claim 9, wherein said one electrodes are omitted from the memory cells each comprising the single switching element and the single ferroelectric capacitor and said memory cells are respectively provided with the other electrodes of dummies corresponding to the second selection lines so that layout patterns of the second selection lines are identical in structure to those of said subblock memory circuits.

11. A semiconductor memory device including a memory block having first and second subblock memory circuits, said first and second subblock memory circuits respectively including:

a first address selection line;

a data line;

a switching element having a first terminal and a second terminal connected to said data line and a control terminal connected to said first address selection line;

a first storage element having a first electrode and a second electrode connected to said data line; and a second storage element having a third electrode and a fourth electrode connected to said data line, said first terminal of said switching element in said first subblock memory circuit and said first terminal of said switching element in said second subblock memory circuit being connected to a main data line, said first electrode of said first storage element in said first subblock memory circuit and said first electrode of said first storage element in said second subblock memory circuit being connected to a second address selection line, said third electrode of said second storage element in said first subblock memory circuit and said third electrode of said second storage element in said second subblock memory circuit being connected to a third address selection line, said semiconductor memory device further including a means for controlling the application of a first voltage enabling said first storage element in said first subblock memory circuit to be polarized, between the first and second electrodes of said first storage element in said first subblock memory circuit when said first storage element in said first subblock memory circuit is selected, and controlling the application of a second voltage making unable to polarize said second storage element in said first subblock memory circuit and said first and second storage elements in said second subblock memory circuit, between the third and fourth electrodes of said second storage element in said first subblock memory circuit, between the first and second electrodes of said first storage element in said second subblock memory circuit and between the third and fourth electrodes of said second storage element in said second subblock memory circuit when said first storage element in said first subblock memory circuit is selected.

* * * * *